United States Patent
Paul et al.

(10) Patent No.: US 12,310,046 B2
(45) Date of Patent: May 20, 2025

(54) ENHANCED MOSFET WITH SUPERIOR RF PERFORMANCE

(71) Applicant: QUALCOMM Incorporated, San Diego, CA (US)

(72) Inventors: Abhijeet Paul, Escondido, CA (US); Ravi Pramod Kumar Vedula, San Diego, CA (US); Hyunchul Jung, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 569 days.

(21) Appl. No.: 17/661,221

(22) Filed: Apr. 28, 2022

(65) Prior Publication Data
US 2023/0352583 A1 Nov. 2, 2023

(51) Int. Cl.
*H10D 30/60* (2025.01)
*H03F 3/21* (2006.01)
*H10D 30/01* (2025.01)

(52) U.S. Cl.
CPC ........... *H10D 30/603* (2025.01); *H03F 3/211* (2013.01); *H10D 30/022* (2025.01); *H03F 2200/294* (2013.01); *H03F 2200/451* (2013.01)

(58) Field of Classification Search
CPC ........... H01L 29/7835; H01L 29/66492; H03F 3/211; H03F 2200/294; H03F 2200/451
USPC ......................................................... 330/277
See application file for complete search history.

(56) References Cited

U.S. PATENT DOCUMENTS

| | | | | |
|---|---|---|---|---|
| 6,078,080 A | * | 6/2000 | Kadosh | H01L 29/66659 257/E29.268 |
| 6,271,563 B1 | * | 8/2001 | Yu | H01L 29/66643 257/408 |
| 7,400,863 B2 | * | 7/2008 | Kobayashi | H03F 3/245 455/73 |
| 8,753,941 B1 | * | 6/2014 | Benaissa | H01L 29/1083 438/231 |
| 10,340,289 B2 | * | 7/2019 | Dutta | H03F 3/245 |
| 11,990,474 B2 | * | 5/2024 | Fu | H01L 27/092 |
| 2011/0266626 A1 | * | 11/2011 | Herberholz | H01L 29/7835 257/E27.06 |

(Continued)

OTHER PUBLICATIONS

Wang et al., MOSFET Performance Manufactured on , 100. Silicon Wafer Using CESL Strain Technology with Temperature Effect, vols. 287-290, pp. 2974-2977 © 2011 Trans Tech Publications Ltd, Switzerland. (Year: 2011).*

(Continued)

*Primary Examiner* — Hafizur Rahman
(74) *Attorney, Agent, or Firm* — Muncy, Geissler, Olds & Lowe, P.C.

(57) ABSTRACT

Disclosed is a transistor of a device that has an asymmetric resistance or an asymmetric capacitive coupling or both. When used in a cascode configuration in an amplifier, low current performance of the amplifier is improved. Asymmetric resistance may be enabled through differentially doping source and drain structures of the transistor and/or through differentially manipulating geometries the source and drain structures. Asymmetric capacitive coupling may be enabled through providing dielectrics and differentially locating the dielectrics above a gate of the transistor. Further, a body of the transistor may be biased.

25 Claims, 16 Drawing Sheets

(56) References Cited

U.S. PATENT DOCUMENTS

| | | | | |
|---|---|---|---|---|
| 2013/0126970 | A1* | 5/2013 | Bulucea | H01L 29/66659 |
| | | | | 257/335 |
| 2014/0374773 | A1* | 12/2014 | Ryu | H01L 27/088 |
| | | | | 257/77 |
| 2015/0044838 | A1* | 2/2015 | Herberholz | H01L 21/823437 |
| | | | | 438/275 |
| 2017/0126180 | A1* | 5/2017 | Bakalski | H03F 3/2171 |
| 2018/0233578 | A1* | 8/2018 | Shi | H01L 21/823412 |
| 2020/0357799 | A1* | 11/2020 | Fu | H01L 21/823807 |
| 2021/0013841 | A1* | 1/2021 | Klaren | H03F 1/56 |
| 2021/0151582 | A1* | 5/2021 | Shi | H01L 21/823412 |
| 2022/0254914 | A1* | 8/2022 | Toner | H01L 29/782 |
| 2022/0360235 | A1* | 11/2022 | Jiang | H03F 3/193 |
| 2024/0136984 | A1* | 4/2024 | Jiang | H03F 1/56 |

OTHER PUBLICATIONS https://kids.kiddle.co/Image:MOSFET_junction_structure.png. (published in Dec. 6, 2020 and henceforth referred to as kids.kiddle) (Year: 2020).*

Chen C.L., et al., "Improvement of SOI MOSFET RF Performance by Implant Optimization", IEEE Microwave and Wireless Components Letters, vol. 20, No. 5, May 2010, pp. 271-273.

\* cited by examiner

ENHANCED MOSFET WITH SUPERIOR RF PERFORMANCE

FIELD OF DISCLOSURE

This disclosure relates generally to high performance devices, and more specifically, but not exclusively, to devices such as metal oxide semiconductor field effect transistors (MOSFET) with superior radio frequency (RF) performances and fabrication techniques thereof.

BACKGROUND

Integrated circuit technology has achieved great strides in advancing computing power through miniaturization of active and passive components. The package devices can be found in many electronic devices, including processors, servers, radio frequency integrated circuits, etc.

In radio frequency front end technology, there is a constant push to improve RF performance in devices such as low noise amplifiers (LNA). There are ways to improve performances. This is illustrated in FIG. 1 which illustrates a graph of a performance of two transistors—a conventional transistor vs an improved conventional transistor. Conventionally, the improvements normally occur in the region of peak performance, i.e., when the at high current densities and correspondingly at high power.

Unfortunately, devices such as LNAs normally operate at low current densities. This is an important factor for devices that are battery powered such as mobile devices. Unfortunately, in this low current density operating region, there is little to no performance improvements with the improved conventional transistors. Accordingly, there is a need for systems, apparatus, and methods that overcome the deficiencies of conventional devices including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary transistor is disclosed. The transistor may comprise a first dielectric layer on an implant layer. The transistor may also comprise a source contact, a drain contact, and a gate structure within the first dielectric layer. The gate structure may be between the source contact and the drain contact and comprise a gate oxide, a gate on the gate oxide, a source side spacer, and a drain side spacer. The source side spacer may be on sides of the gate and the gate oxide facing the source contact. The drain side spacer may be on sides of the gate and the gate oxide facing the drain contact. The transistor may further comprise a source implant structure within the implant layer and electrically coupled with the source contact. The source implant structure may comprise a source well, a source extension, and a source halo. The source well may be below the source contact. The source extension may extend from the source well to below at least a portion of the source side spacer. The source halo may be below the source extension and vertically overlap at least a part of the source side spacer. The transistor may yet comprise a drain implant structure within the implant layer and electrically coupled with the drain contact. The drain implant structure may comprise a drain well, a drain extension, and a drain halo. The drain well may be below the drain contact. The drain extension may extend from the drain well to below at least a portion of the drain side spacer. The drain halo may be below the drain extension and vertically overlap at least a part of the drain side spacer. The transistor may have an asymmetric resistance or an asymmetric capacitive coupling or both. The asymmetric resistance may be when a resistance of the drain implant structure is different from a resistance of the source implant structure. The asymmetric capacitive coupling may be when a capacitive coupling between the gate and the source contact is different from a capacitive coupling between the gate and the drain contact.

A method of fabricating a transistor is disclosed. The method may comprise forming a first dielectric layer on an implant layer. The method may also comprise forming a source contact, a drain contact, and a gate structure within the first dielectric layer. The gate structure may be between the source contact and the drain contact and comprise a gate oxide, a gate on the gate oxide, a source side spacer, and a drain side spacer. The source side spacer may be on sides of the gate and the gate oxide facing the source contact. The drain side spacer may be on sides of the gate and the gate oxide facing the drain contact. The method may further comprise forming a source implant structure within the implant layer and electrically coupled with the source contact. The source implant structure may comprise a source well, a source extension, and a source halo. The source well may be below the source contact. The source extension may extend from the source well to below at least a portion of the source side spacer. The source halo may be below the source extension and vertically overlap at least a part of the source side spacer. The method may yet comprise forming a drain implant structure within the implant layer and electrically coupled with the drain contact. The drain implant structure may comprise a drain well, a drain extension, and a drain halo. The drain well may be below the drain contact. The drain extension may extend from the drain well to below at least a portion of the drain side spacer. The drain halo may be below the drain extension and vertically overlap at least a part of the drain side spacer. The transistor may have an asymmetric resistance or an asymmetric capacitive coupling or both. The asymmetric resistance may be when a resistance of the drain implant structure is different from a resistance of the source implant structure. The asymmetric capacitive coupling may be when a capacitive coupling between the gate and the source contact is different from a capacitive coupling between the gate and the drain contact.

An exemplary amplifier is disclosed. The amplifier may comprise an amplifying transistor. A source of the amplifying transistor may be configured to receive a low voltage. A gate of the amplifying transistor may be configured to receive an input voltage. The amplifier may also comprise a cascode transistor. A source of the cascode transistor may be configured to connect with a drain of the amplifying transistor. A gate of the cascode transistor may be configured to receive a bias voltage. A drain of the cascode transistor may be configured to provide an output voltage. The output voltage may be an amplified version of the input voltage.

The cascode transistor may have an asymmetric resistance or an asymmetric capacitive coupling or both. The asymmetric resistance of a transistor may be when a resistance of a drain of the transistor is different from a resistance of a source of the transistor. The asymmetric capacitive coupling of a transistor may be when a capacitive coupling between a gate and a source of the transistor is different from a capacitive coupling between the gate and a drain of the transistor.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
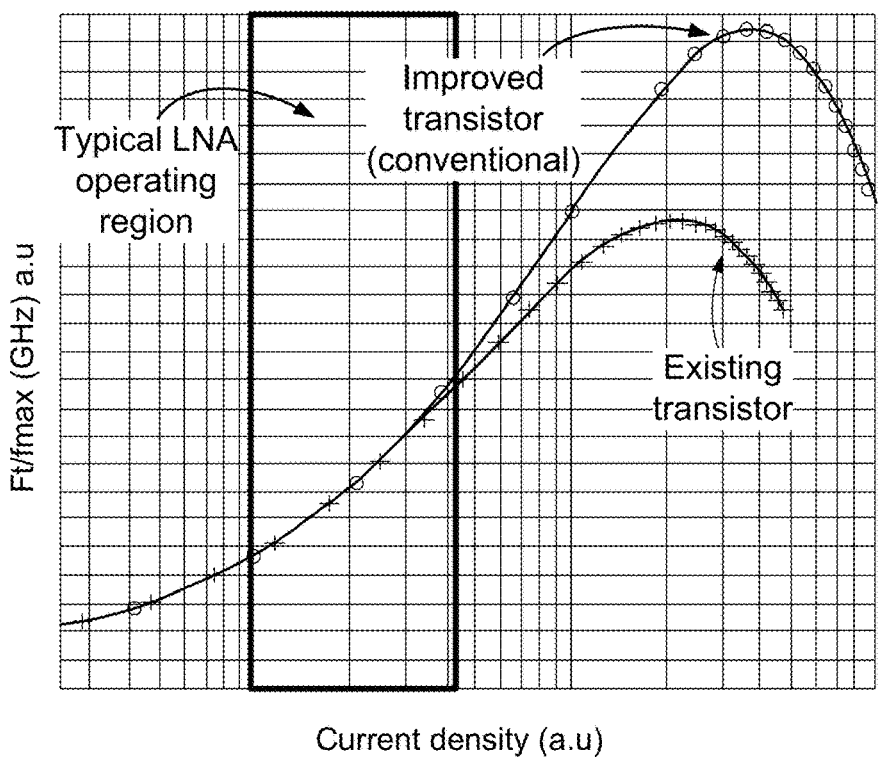
FIG. 1 illustrate a graph of performances of a conventional transistor and an improved conventional transistor.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It is indicated above that performance of conventional transistors can be improved. Some key performance metrics of a transistor in RF applications are Ft and Fmax, which are related to gains in current and power, respectively. Conventionally, improvements in metrics such as Ft and Fmax can be made through updating the fabrication processes. This can be costly with longer cycle times. Traditionally, the improvements are generally in peak performance—in the high current density operating region. Such improvements may be appropriate for transistors of power amplifiers (PA).

However, there is very little, if any, improvements in low current density performance. Unfortunately, for some applications such as for LNAs, the normal operating region is the low current density region. Thus, the conventional improvements may be of little use for such applications.

To address one or more shortfalls of conventional improvements to a transistor, it is proposed to improve transistor performance in operating regions appropriate for a given application. That is, a transistor may be optimized for performance within an operating region of interest. For example, for LNA applications, performance improvements at low current densities can be more appropriate rather than improvements at peak current densities. In other words, the operating region of interest for LNAs may be in the low current density region.

Figure 2:
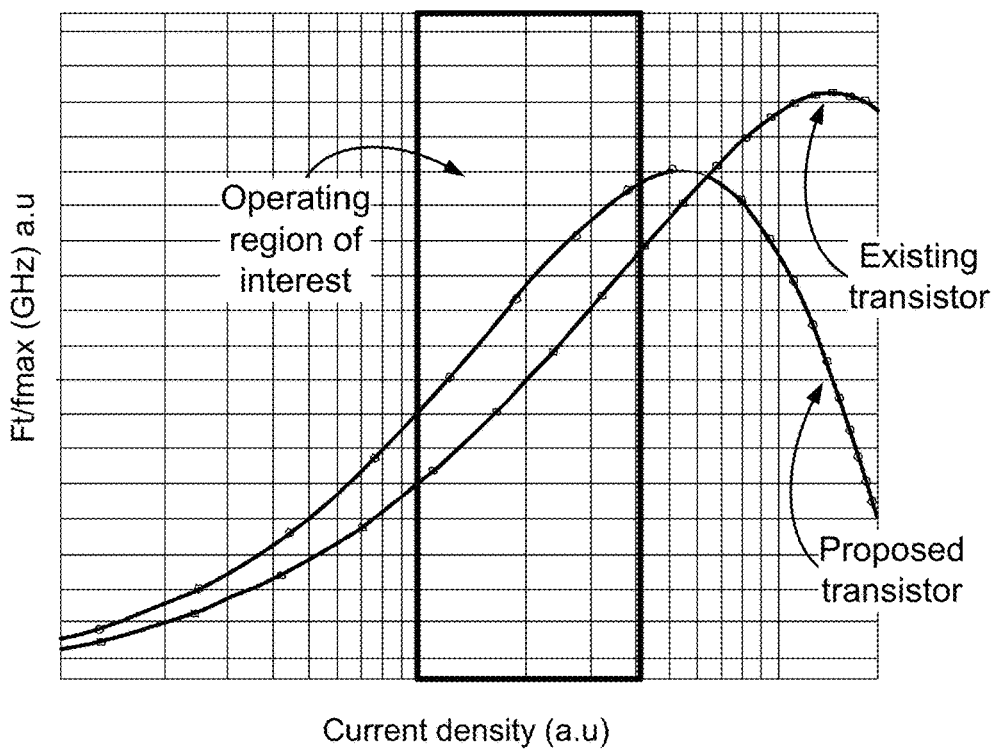
FIG. 2 illustrate a graph of performances of a conventional transistor and a transistor in accordance with one or more aspects of the disclosure.

This is illustrated in FIG. 2. Outside of the operating region of interest (e.g., at high current density region), the proposed transistor may sacrifice performance relative to the conventional existing transistor. However, within the operating region of interest, the proposed transistor has better performance than the existing transistor.

In an aspect, the proposed transistor may be MOSFET. For ease of distinction, the proposed transistor may be referred to as an "enhanced" MOSFET, or more generally, an enhanced transistor. For applications such as LNA, the proposed enhanced MOSFET may improve performance by at least 15% and as much as 25%. Also, while LNA has been mentioned in particular, the enhanced transistors may be used in other applications such as cascode design analog applications.

Figure 3A:
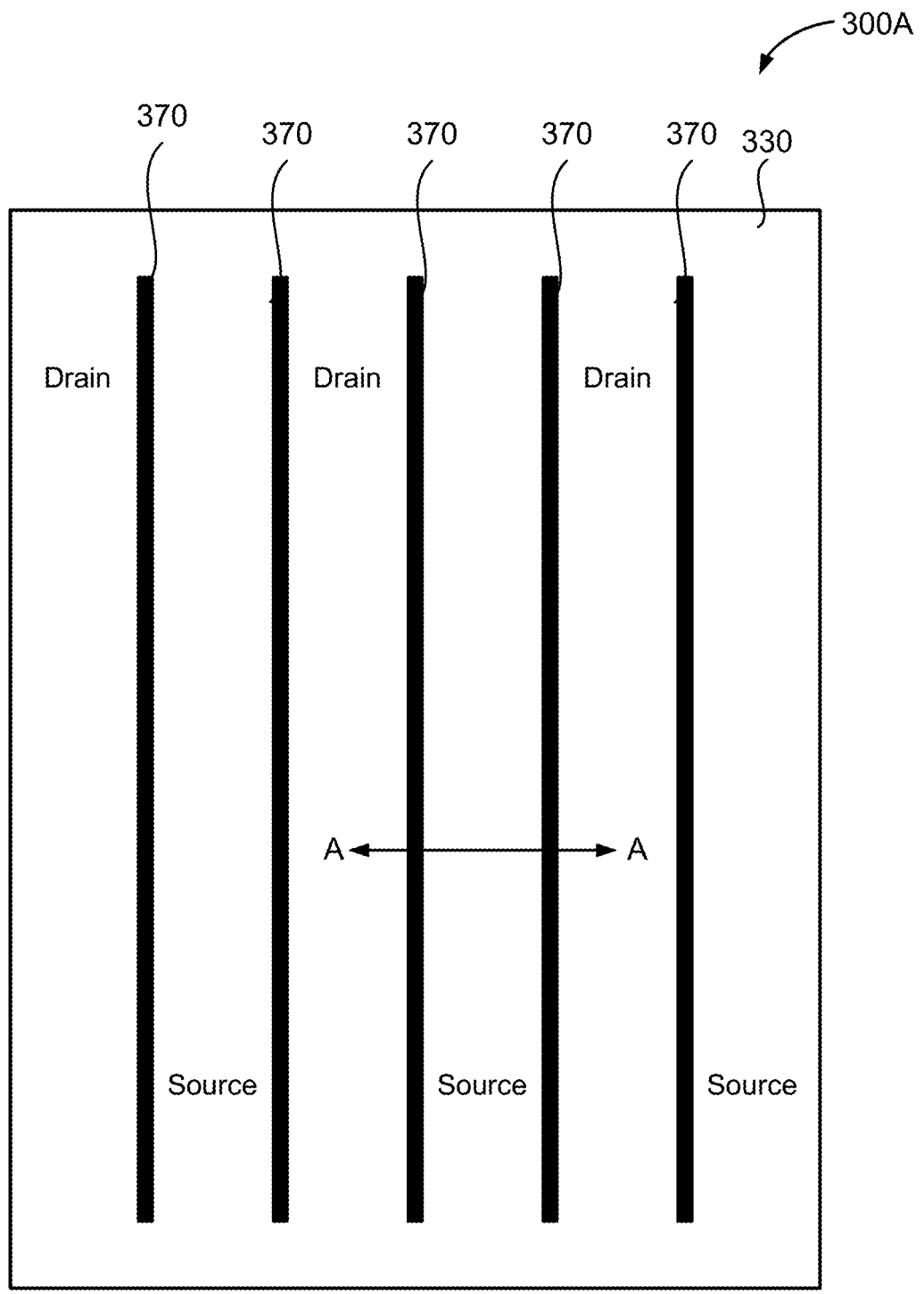
FIGS. 3A, 3B and 3C illustrate example layouts of transistors in accordance with one or more aspects of the disclosure.
Figure 3B:
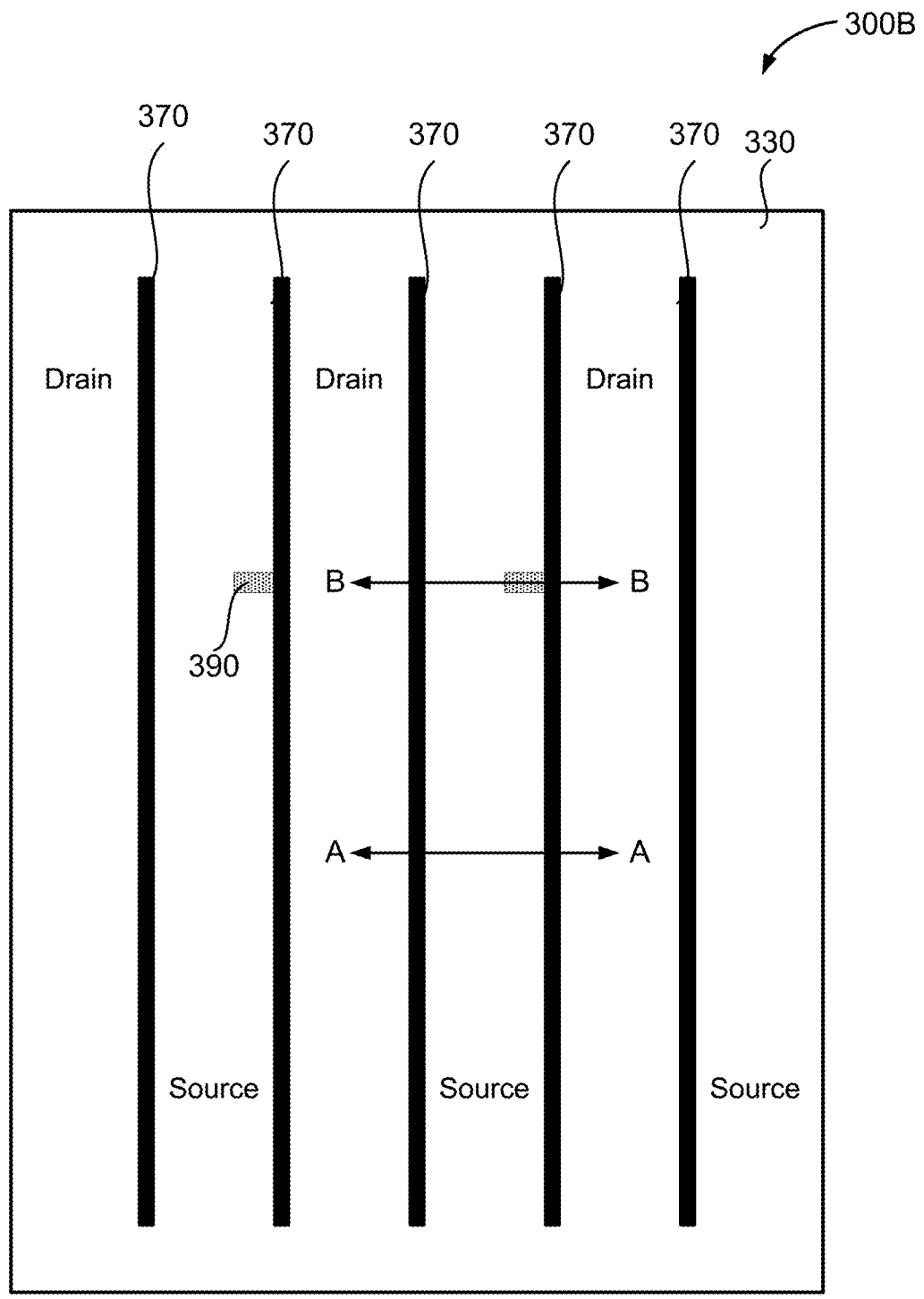
Figure 3C:
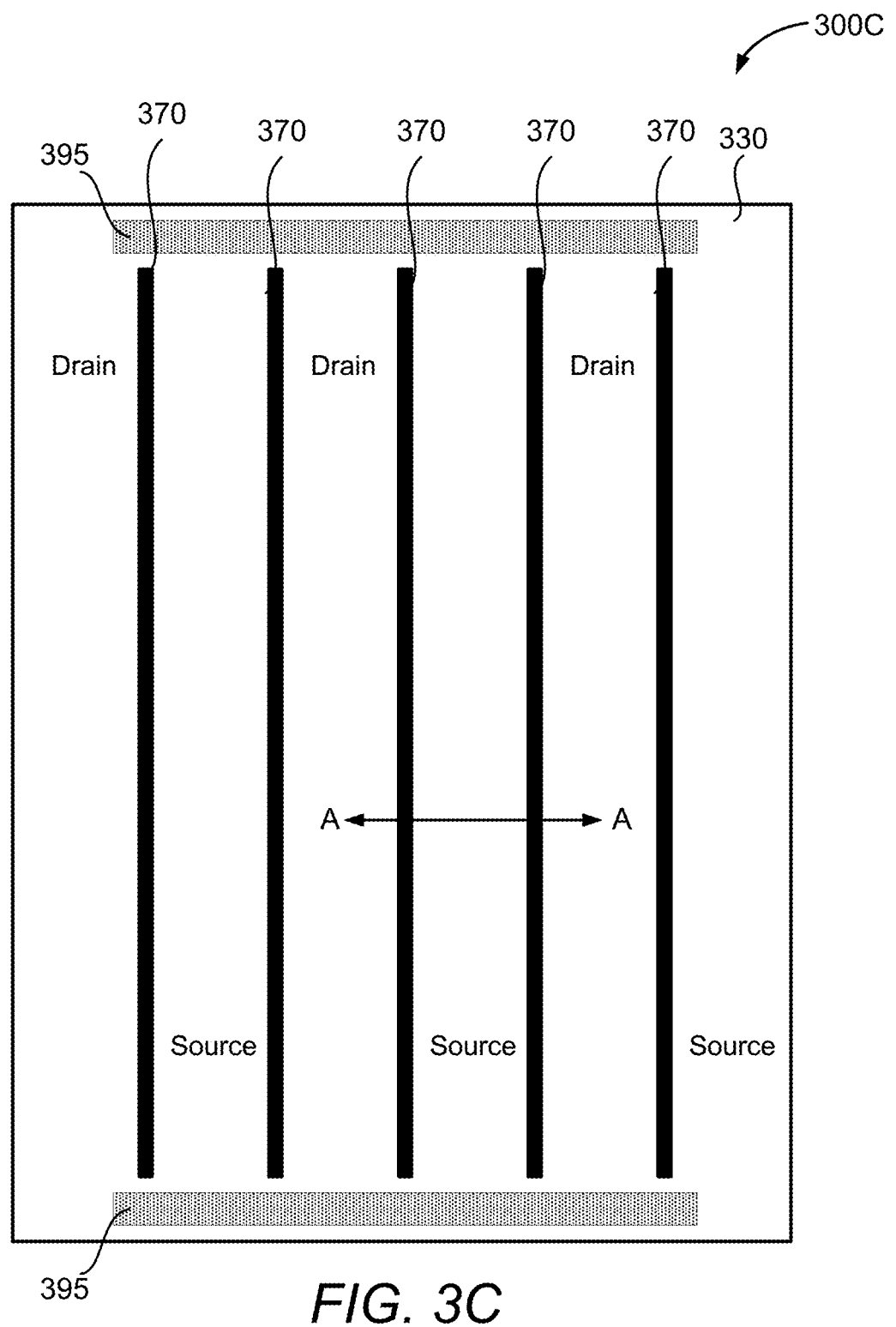

FIGS. 3A, 3B and 3C illustrate example layouts of transistors such as MOSFETs. The views illustrated in FIGS. 3A, 3B and 3C are vertical views of layouts 300A, 300B and 300C, respectively. As seen in FIG. 3A, the layout 300A may include an implant layer 330 with a plurality of gates 370 dividing the implant layer 330 into alternating source and drain regions. The FETs of the configuration illustrated in FIG. 3A may be three terminal devices that include gate, source and drain terminals or contacts.

As seen in FIG. 3B, the layout 300B may also include the implant layer 330 and the plurality of gates 370. The layout 300B may further include one or more body taps 390. The body taps 390 may extend from gates 370 into source regions. The body taps 390 may enable body-to-source couplings for the transistors. In some applications such as low frequency analog applications, it is advantageous to control the body of a transistor. Body-to-source couplings for transistors, such as FETs, can provide designers a way to control the body. The FETs of the configuration illustrated in FIG. 3B may also be three terminal devices that include gate, source and drain terminals or contacts. In this instance, the body to source may be internally coupled via the body taps 390.

Like FIGS. 3A and 3B, the layout 300C of FIG. 3C may include the implant layer 330 and the plurality of gates 370. But in addition, the layout 300C may include one or more body taps. In an aspect, the body tap region 395 may be located below the plurality of gates 370, above the plurality of gates 370, or both. The body tap region 395 may also enable body-to-source couplings for the transistors. Similar to the body taps 390, body tap region 395 can also provide ways to control the bodies of transistors. While not shown, the body tap region 395 may include a plurality of contacts. The FETs in the configuration illustrated in FIG. 3C may be four terminal devices that include gate, source, drain and body terminals or contacts. While not specifically illustrated, it should be noted that in one or more aspects, a layout may have both body taps 390 and body tap regions 395.

Figure 4:
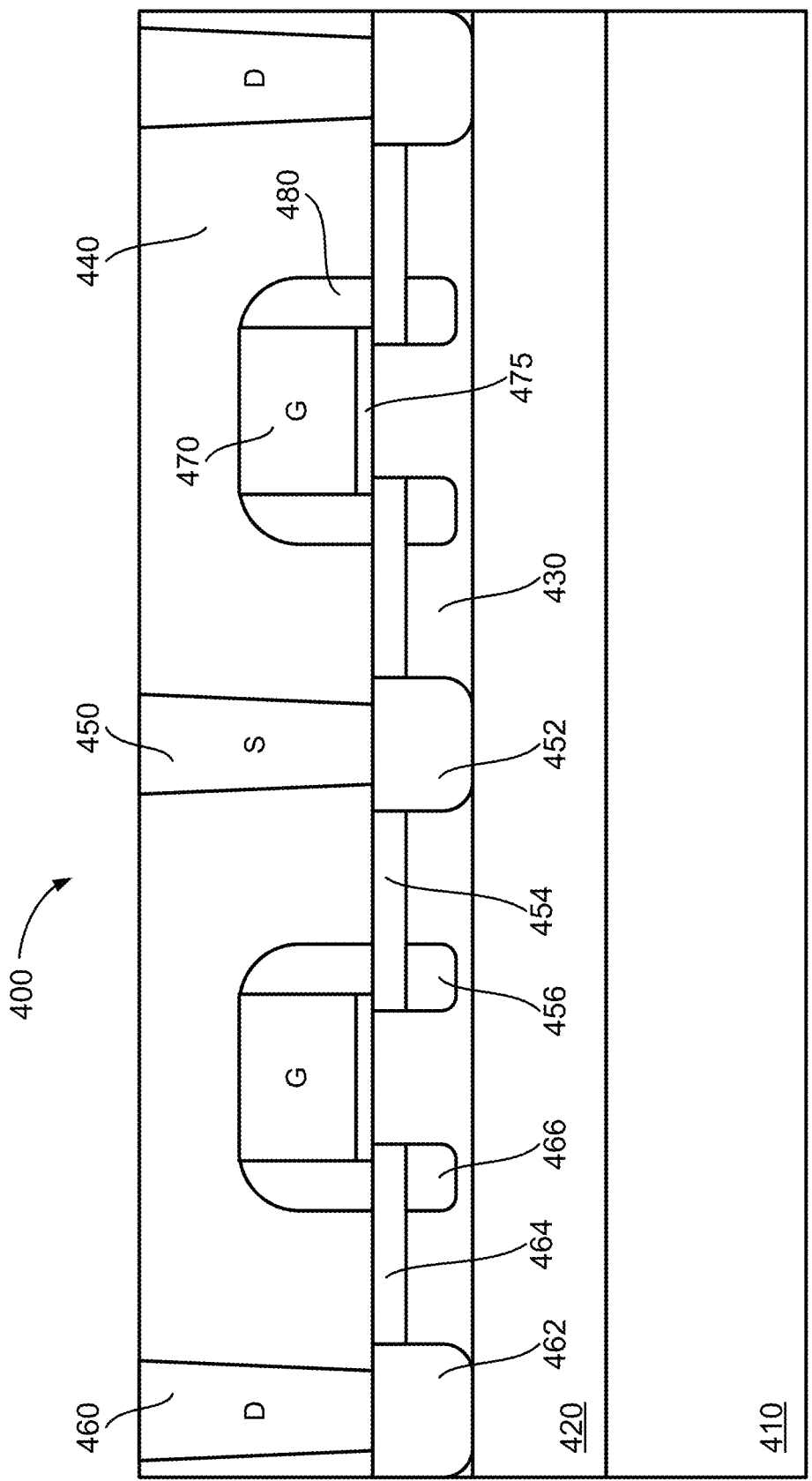
FIG. 4 illustrates a cross sectional view of an improved conventional MOSFET.

FIG. 4 illustrates a cross sectional view of a conventional (regular or improved) MOSFET 400 along the line A-A of FIG. 3A for example. The MOSFET 400 includes a substrate 410, a buried oxide (BOX) layer 420 on the substrate 410, an implant layer 430 on the BOX layer 420, and a dielectric layer 440 on the implant layer 430. A source contact 450, a drain contact 460, and a gate 470 above a gate oxide 475 is formed within the dielectric layer 440. The gate 470 is in between the source contact 450 and the drain contact 460. Spacers 480 are formed on the sides of the gate 470.

A source well 452, a source extension 454, and a source halo 456 are formed in the implant layer 430. The source well 452, the source extension 454, and the source halo 456 are all doped. The source well 452 is formed below the source contact 450 and is in contact with the source contact 450. The source extension 454 extends from the source well 452 towards the gate 470. The source halo 456 is formed below the source extension 454. For ease of description, the source well, source well 452, the source extension 454, and the source halo 456 will be described as a source implant structure.

A drain well 462, a drain extension 464, and a drain halo 466 are also formed in the implant layer 430. The drain well 462, the drain extension 464, and the drain halo 466 are all doped. The drain well 462 is formed below the drain contact 460 and is in contact with the drain contact 460. The drain extension 464 extends from the drain well 462 towards the gate 470. The drain halo 466 is formed below the drain extension 464. For ease of description, the drain well 462, the drain extension 464, and the drain halo 466 will be described as a drain implant structure.

In the improved conventional MOSFET 400, the resistance of the source and drain implant structures are symmetric. That is, the resistances are virtually the same, i.e., they are within fabricating tolerances other. The capacitance between the gate and source contact and the capacitance between the gate and the drain contact—the coupling capacitances—are also symmetric. That is, the coupling capacitances are virtually the same, i.e., they are within fabricating tolerances of each other. As indicated, the improved conventional MOSFET 400 can increase peak performance, but has little to no improvement in low current density performance.

Figure 5A:
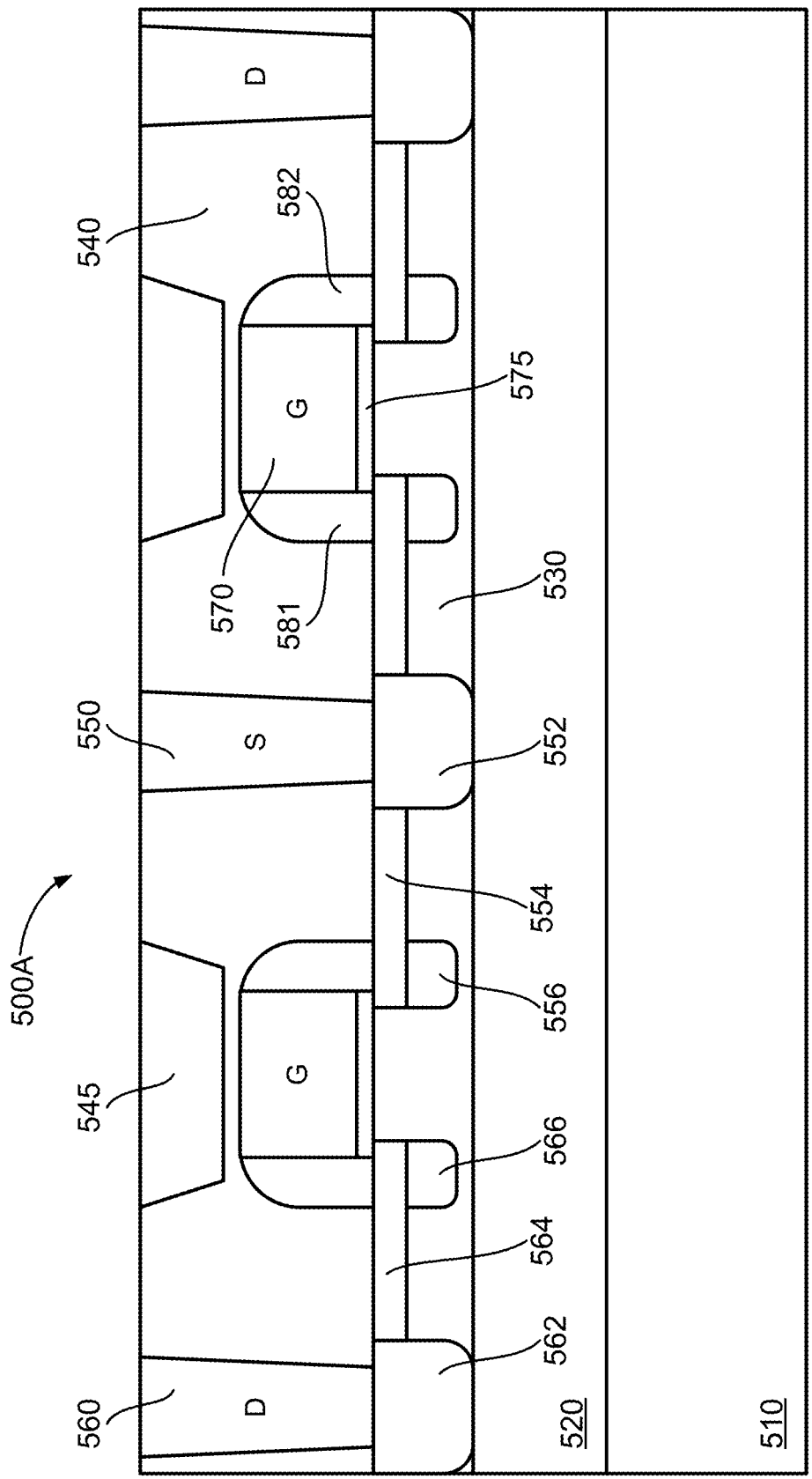
FIGS. 5A, 5B and 5C illustrate cross sectional views transistors in accordance with one or more aspects of the disclosure.

FIG. 5A illustrate cross sectional view of a transistor 500A—an enhanced transistor—in accordance with one or more aspects of the disclosure. The view may correspond to the line A-A of FIGS. 3A, 3B and/or 3C. The transistor 500A may be a MOSFET. For descriptive purposes, NMOSFET will be assumed for the transistor 500A as well as other transistors described further below. That is, it may be assumed that various components of the transistor 500A may be N doped (e.g., with N type impurities) unless specifically stated otherwise. However, it should be noted that PMOSFETs are also contemplated. That is, the various components may be P doped (e.g., P type impurities). It should be relatively straight forward for one skilled in the art to implement PMOSFET versions from the description that will be provided.

The transistor 500A may include a substrate 510, an insulator layer 520 on the substrate 510, an implant layer 530 on the insulator layer 520, and a first dielectric layer 540 on the implant layer 530. The substrate 510 may be a handle substrate and formed from materials such as silicon (Si), group III-V material, glass, aluminum nitride (AlN), etc. the insulator layer 520 may be a BOX layer.

A source contact 550 and a drain contact 560 may be formed on the implant layer 530 within the first dielectric layer 540. That is, lower surfaces of the source contact 550, the drain contact 560, and the first dielectric layer 540 may be planar. The source contact 550 and the drain contact 560 may be formed from conductive materials such as metal (e.g., copper (Cu), aluminum (Al), etc.) and/or polysilicon. Top surfaces of the source and drain contacts 550, 560 may also be exposed to enable the transistor 500A be connected to external components and devices. Transistor 500A may be said to be an example of a three terminal device that includes gate, source, and drain contacts (or terminals).

A gate structure may be formed on the implant layer 530 within the first dielectric layer 540 between the source contact 550 and the drain contact 560. The gate structure may include a gate oxide 575 formed on the implant layer 530 and a gate 570 formed on the gate oxide 575. The gate 570 may be formed from conductive materials such as polysilicon or metal (e.g., Cu, Al, etc.). The gate structure may also include a source side spacer 581 and a drain side spacer 582. The source side spacer 581 may be formed on the implant layer 530 and on sides of the gate 570 and the gate oxide 575 facing the source contact 550. The drain side spacer 582 may be formed on the implant layer 530 and on sides of the gate 570 and the gate oxide 575 facing the drain contact 560.

A source implant structure and a drain implant structure may be formed within the implant layer 530. The source implant structure may be electrically coupled with the source contact 550 and may comprise a source well 552, a source extension 554, and a source halo 556. The source well 552, the source extension 554, and the source halo 556 may be doped (e.g., N doped for NMOSFET, P doped for PMOSFET). The source well 552 may be formed below the source contact 550 and electrically couple with the source contact 550. For example, an upper surface of the source well 552 may be planar with an upper surface of the implant layer 530 such that the source well 552 is in contact with the source contact 550. The source extension 554 may extend from the source well 552 to below the gate structure. In an aspect, the source extension 554 may extend to below at least a portion of the source side spacer 581. In another aspect, the source extension 554 may extend sufficiently far so that an end part of the source extension 554 vertically overlaps a part of the gate 570. An upper surface of the source extension 554 may be planar with the upper surface of the implant layer 530. As such, the end part of the source extension 554 may be in contact with the lower surface of the first dielectric layer 540 (e.g., in contact with at least a part of the source side spacer 581 and/or the gate oxide 575). The source halo 556 may be formed below the source extension 554. In an aspect, the source halo 556 may vertically overlap at least a part of the source side spacer 581.

The drain implant structure may be electrically coupled with the drain contact 560 and may comprise a drain well 562, a drain extension 564, and a drain halo 566. The drain well 562, the drain extension 564, and the drain halo 566 may be doped (e.g., N doped for NMOSFET, P doped for PMOSFET). The drain well 562 may be formed below the drain contact 560 and electrically couple with the drain contact 560. For example, an upper surface of the drain well 562 may be planar with the upper surface of the implant layer 530 such that the drain well 562 is in contact with the drain contact 560. The drain extension 564 may extend from the drain well 562 to below the gate structure. In an aspect, the drain extension 564 may extend to below at least a portion of the drain side spacer 582. In another aspect, the drain extension 564 may extend sufficiently far so that an end part of the drain extension 564 vertically overlaps a part of the gate 570. An upper surface of the drain extension 564 may be planar with the upper surface of the implant layer 530. As such, the end part of the drain extension 564 may be in contact with the lower surface of the first dielectric layer 540 (e.g., in contact with at least a part of the drain side spacer 582 and/or the gate oxide 575). The drain halo 566 may be formed below the drain extension 564. In an aspect, the drain halo 566 may vertically overlap at least a part of the drain side spacer 582.

Unlike the conventional MOSFET 400 of FIG. 4, with the proposed transistor 500A, the resistance of the source implant structure may be different from the resistance of the drain implant structure. In other words, the transistor 500A may have an asymmetric resistance. In an aspect, the resistance of the drain implant structure may be greater than a resistance of the source implant structure for the transistor 500A. In doing so, the output resistance Rout of the transistor 500A may be increased, which can improve the self-gain Gds of the transistor.

In one aspect, the asymmetric resistance may be achieved by differently doping the source and drain implant structures. For example, the drain well 562 may be less doped than the source well 552. Alternatively or in addition thereto, the drain extension 564 may be less doped than the source extension 554. Alternatively or also in addition thereto, the drain halo 566 may be less doped than the source halo 556.

In another aspect, the asymmetric resistance may be achieved through geometry. For example, the drain extension 564 may be made to be thinner than the source extension 554. More generally, a cross section of the drain extension 564 may be smaller than a cross section of the source extension 554. Alternatively or in addition thereto, the drain halo 566 may be smaller than the source halo 556. Note that differential doping and differential geometry may be combined in some aspects.

In addition to asymmetric resistance, the transistor 500A may also have asymmetric capacitive coupling. Asymmetric capacitive coupling may be described as there being a difference between a gate-source capacitive coupling and a gate-drain capacitive coupling. That is, the transistor 500A can have asymmetric capacitive coupling when the capacitive coupling between the gate 570 and the source contact 550 is different from the capacitive coupling between the gate and the drain contact 560.

In one aspect, the differential doping may be achieved by separately masking and doping the drain and source implant structures. For example, the source extension 554 and the source halo 556 may be masked while the drain extension 564 and the drain halo 566 are exposed and doped at one dopant level, and then the drain extension 564 and the drain halo 566 may be separately masked while the source extension 554 and the source halo 556 are exposed and doped at a different dopant level. While this achieves the desired asymmetric doping, there can be some alignment issues when separate masks are used.

The transistor 500A may also include a second dielectric 545 within the first dielectric layer 540 above the gate 570. A dielectric constant of the second dielectric 545 may be different from the dielectric constant of the first dielectric layer 540. For example, the dielectric constant of the second dielectric 545 may be different from (e.g., lower than) the dielectric constant of the first dielectric layer 540. The second dielectric 545 may be a low-k dielectric. Alternatively, an air gap may serve as the second dielectric 545.

The presence of the second dielectric 545 can help to better isolate the input side of the transistor 500A from the output side. That is, the drain-source capacitance Cds between the drain contact 560 and the source contact 550 can be reduced. The second dielectric 545 is shown as being trapezoidal in shape. However, the shape is not so limited, i.e., it may take on any shape conducive to enhance isolation properties. The second dielectric 545 may be formed to enhance the asymmetric capacitive coupling.

Figure 5B:
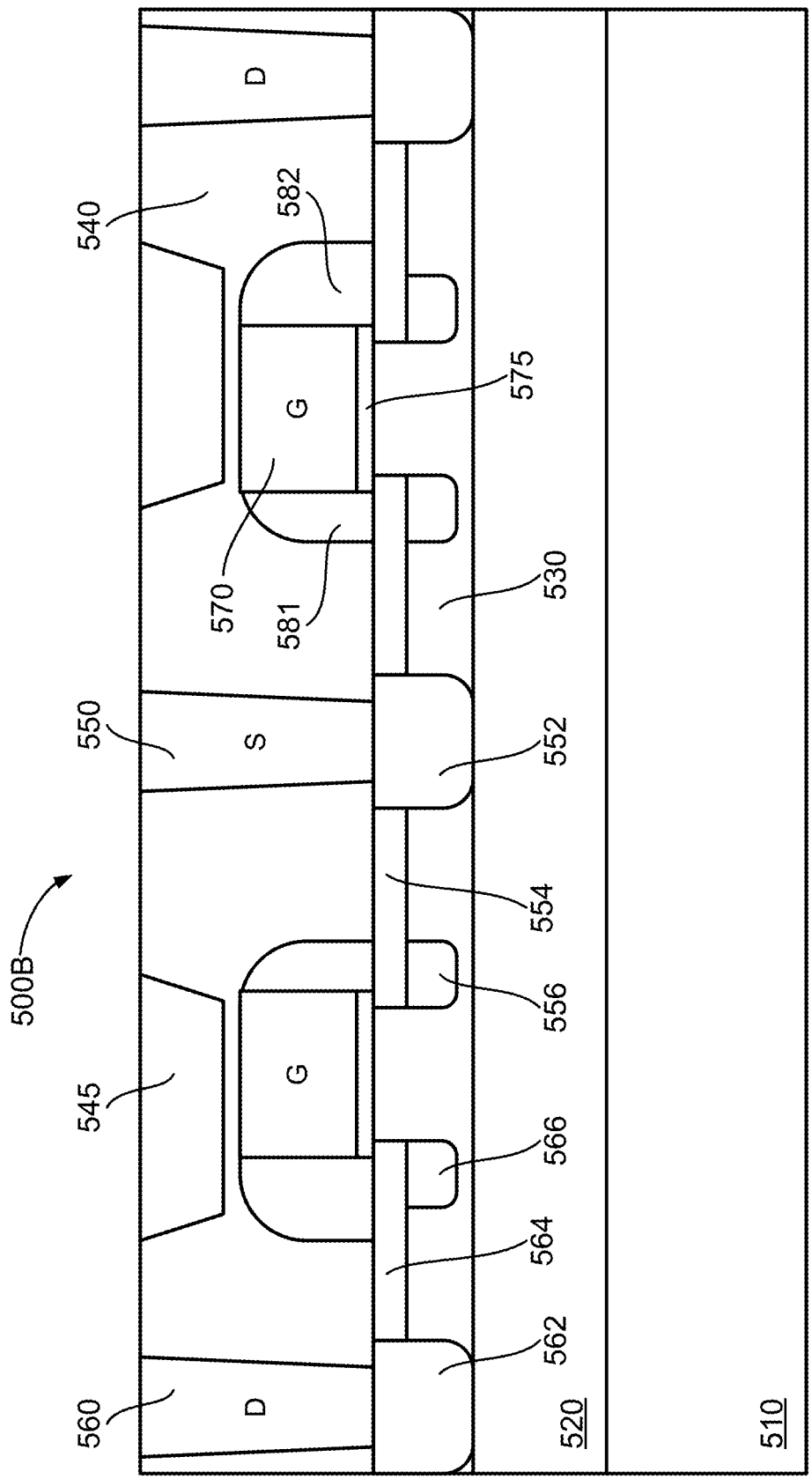

It should be noted that the locations and/or the dimensions of the components of a transistor can be flexible. This is illustrated in FIG. 5B which shows a cross sectional view of another enhanced transistor 500B (e.g., a MOSFET) in accordance with one or more aspects of the disclosure. The view may correspond to the line A-A of FIGS. 3A, 3B and/or 3C. Transistor 500B may also be said to an example of a three device that includes gate, source, and drain contacts (or terminals).

The transistor 500B may include same or similar components as transistor 500A of FIG. 5A, and thus, details of like components will not be repeated for sake of brevity. The transistor 500B demonstrates that the location of the gate structure can be flexible. That is, the center of the gate 570 can be, but need not be equidistant between the drain contact 560 and the source contact 550. In one aspect and as seen in FIG. 5B, the center of the gate 570 may be closer to the drain contact 560 than to the source contact 550. In another aspect, the thicknesses of the source and drain side spacers 581, 582 need not be the same. For example (and as shown), the drain side spacer 582 may be thicker than the source side spacer 581. Through any combination of these measures, there can be an asymmetry between a distance between the drain side spacer 582 and the drain contact 560 ("drain side distance") and a distance between the source side spacer 581 and the source contact 550 ("source side distance"). For example, the drain side distance may be less than the source side distance.

Recall from above that differential doping may be achieved through separately masking and doping the drain and source implant structures. Also recall that there can be when alignment issues when separate masks are used. But in an aspect, the source implant structure as well as the drain implant structure may be formed at the same time through self-alignment without the need for additional mask and still achieve differential doping when there is asymmetry between the drain side distance and the source side distance.

As an explanation, note that in FIGS. 3A, 3B and/or 3C, drain regions (corresponding to drain implant structure of FIGS. 5A and 5B) and source regions (corresponding to source implant structure of FIGS. 5A and 5B) alternate and gates 370 (corresponding to gate structure of FIGS. 5A and 5B) are formed between each drain and source regions. Referring back to FIG. 5B, assume that the pitch (e.g., center-to-center distance) between two adjacent gates structures with a drain region therebetween is smaller than the pitch between two adjacent gate structures with a source region therebetween. An equivalent description may be to say that a distance between adjacent drain side spacers 582 is less than a distance between adjacent source side spacers 581.

Then the source and drain side spacers 581, 582 may be used as masks to form the source implant structure (in particular the source extension 554 and/or the source halo 556) and the drain implant structure (in particular the drain extension 564 and/or the drain halo 566) in one doping process. For example, the dopant may be implanted into the implant layer 530 at a tilt angle that is not normal to the upper surface of the implant layer 530. At such a tilt angle, less dopant penetrates the drain region than the source region due to the asymmetry between the drain side distance and the source side distance. As a result, the drain extension 564 and/or the drain halo 566 may be doped less than the source extension 554 and/or the source halo 556.

Alternatively or in addition to the location of the gate structure being flexible, the location of the second dielectric 545 can be flexible. That is, a center of the second dielectric 545 can be, but need not be vertically aligned with the center of the gate 570.

Figure 5C:
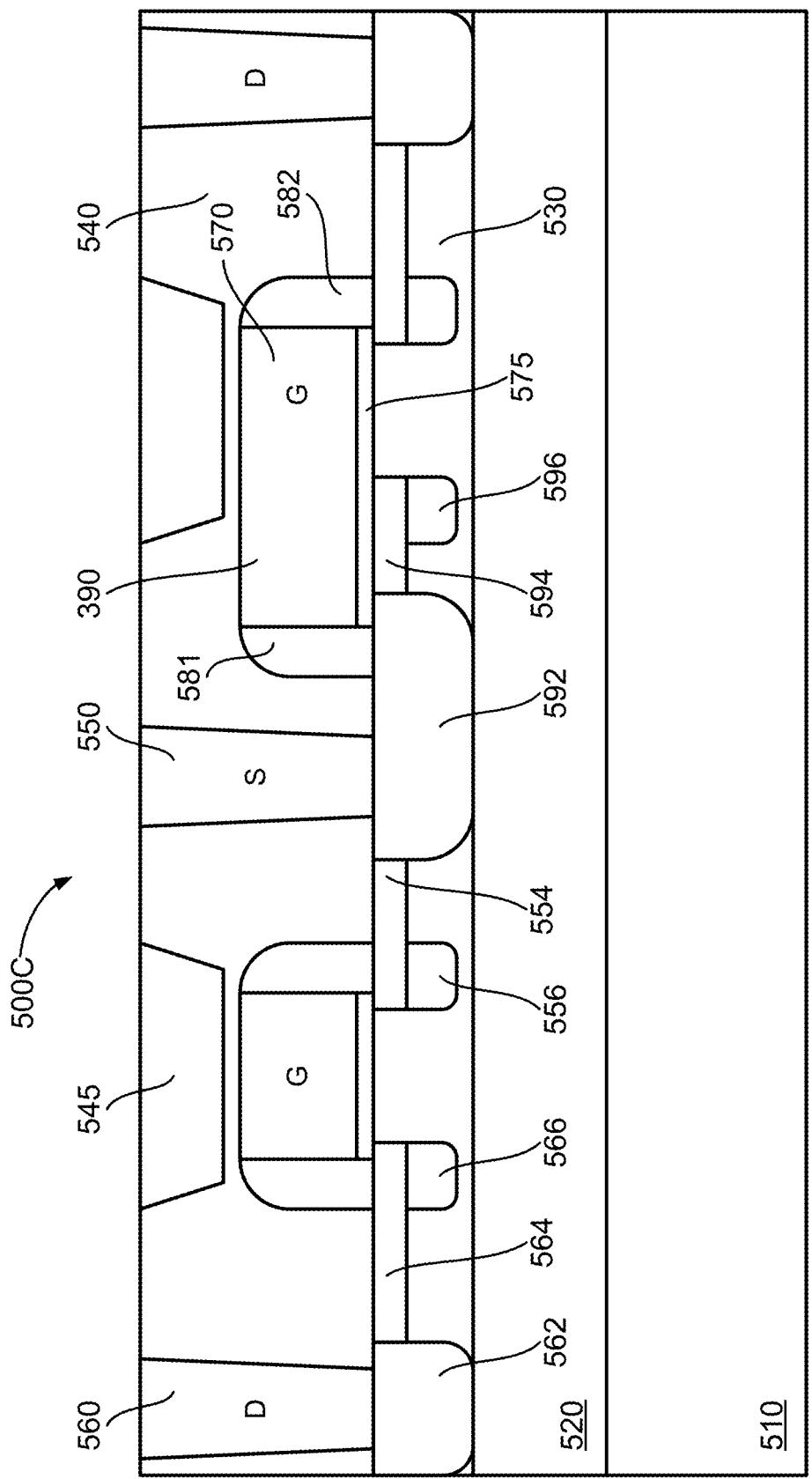

FIG. 5C illustrates a cross sectional view of yet another enhanced transistor 500C (e.g., a MOSFET) in accordance with one or more aspects of the disclosure. Recall that the layout 300B of FIG. 3B may include one or more body taps 390 to enable body-to-source couplings. FIG. 5C illustrates a view that corresponds with the line B-B of FIG. 3B. Transistor 500C may be yet another example of a three device that includes gate, source, and drain contacts (or terminals). In this instance, body to source may be internally coupled via the body taps 390.

The transistor 500C may include same or similar components as transistors 500A and 500B of FIGS. 5A and 5B, and thus, details of like components will not be repeated for sake of brevity. As seen in FIG. 3B, the body tap 390 may extend from the gate 570 into the source regions. In FIG. 5C, this corresponds to the gate structure on the right. Note that the gate structure is relatively wide (e.g., wider than the gate structure on the left), and extends close to the source contact 550. In this instance, the gate structure may further comprise the body tap 390 that extends towards the source contact 550 from the gate 570. In an aspect, the body tap 390 may be formed from the same material as the gate 570, i.e., the body tap 390 and the gate 570 may be integrally formed. The source side spacer 581 may be formed on the side of the body tap 390.

In this instance, a body implant structure may be formed within the implant layer 530 and electrically coupled with the source contact 550. The body implant structure may comprise a body well 592, a body extension 594, and a body halo 596, each of which may be doped. In an aspect, the body well 592 may be doped opposite to the doping of the drain well 562. For example, for an NMOSFET, the body well 592 may be P doped. Conversely, for a PMOSFET, the body well 592 may be N doped. The body well 592 may be formed below the source contact 550 and electrically coupled with the source contact 550. For example, an upper surface of the body well 592 may be planar with the upper surface of the implant layer 530 such that the body well 592 is in contact with the source contact 550. In an aspect, the body well 592 may extend towards the gate 570. Also, the body tap 390 may be a portion of the gate 570 that extends towards the source contact 550. As a result, the source side spacer 581 and at least a first part of the body tap 390 may vertically overlap a portion of the body well 592.

The body extension 594 may extend from the body well 592 to below the gate structure. In an aspect, some or all of the body extension 594 may vertically overlap at least a second part of the body tap 390. An upper surface of the body extension 594 may be planar with the upper surface of the implant layer 530. As such, the body extension 594 may be in contact with the lower surface of the gate oxide 575. The body halo 596 may be formed below the body extension 594. In an aspect, some or all of the body halo 596 may vertically overlap at least a third part of the body tap 390. Portions of the second and third parts of the body tap 390 may be in common. Transistor 500B may be said to be yet another example of a three terminal device that includes gate, source, and drain contacts (or terminals). In this instance, body and source may be internally coupled through the body tap 390.

The transistor 500A, 500B and/or 500C may be used in a variety of applications such as in an LNA. Note that the transistors 500A, 500B and/or 500C may be examples of silicon-on-insulator (SOI) transistors. However, this should not be taken as a limitation. The concepts described are applicable to other types of transistors (e.g., bulk, planar, finfet, etc.).

Figure 6A:
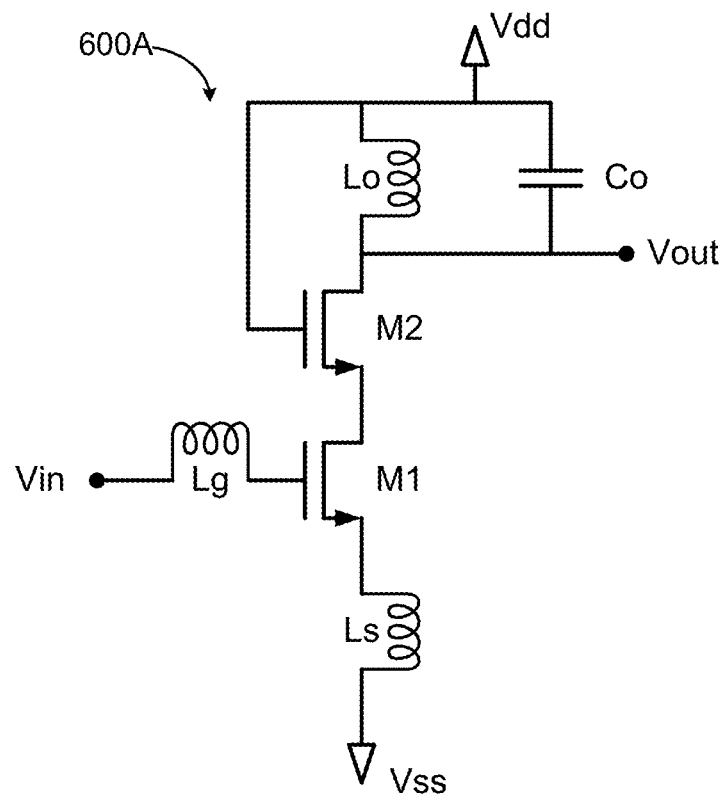
FIGS. 6A, 6B, 6C and 6D illustrate example circuits of amplifiers in accordance with one or more aspects of the disclosure.

FIG. 6A illustrates an exemplary circuit of an amplifier 600A that may utilize one or more asymmetric transistors such as transistors 500A, 500B, 500C. As seen, the amplifier 600A may comprise two transistors M1, M2 connected in series. Again, these transistors are assumed to be N-type FETs (e.g., source and drain implant structures may be N doped). However, as indicated above, P-type counter FETs (e.g., source and drain implant structures may be P doped) are also contemplated.

Transistor M1 may be referred to as an amplifying transistor and transistor M2 may be in a cascode configuration, and thus may be referred to as a cascode transistor. The source of the amplifying transistor M1 may be configured to receive a low voltage (e.g., Vss), and the gate of the amplifying transistor M1 may be configured to receive an input voltage, e.g., through a gate inductor Lg. The input voltage may be an input signal such as an RF input (RFin) signal.

The source of the cascode transistor M2 may be configured to connect with the drain of the amplifying transistor M1, i.e., they may be at the same voltage level. The gate of the cascode transistor M2 may be configured to receive a bias voltage (e.g., DC bias voltage). In this instance, the gate of cascode transistor M2 may be tied to a high voltage (e.g., Vdd). The drain of the cascode transistor M2 may be configured to provide an output voltage, which may be an amplified version of the input voltage. Thus, if the input voltage is RFin, then the output voltage may be an RF output (RFout) signal. There may be passive elements (e.g., output inductor Lo, output capacitor Co, etc.) between the drain of the cascode transistor M2 and the high voltage.

In one aspect, the cascode transistor M2 may be the same or similar to transistors 500A, 500B, 500C. That is, the cascode transistor M2 may have asymmetric resistance and/or asymmetric capacitive coupling. Recall that a transistor may have asymmetric resistance when a resistance of the drain of the transistor (e.g., resistance of the drain contact and the drain implant structure) is different from a resistance of the source implant structure of the transistor (e.g., resistance of the source contact and the source implant structure). Also recall that a transistor may have asymmetric capacitive coupling when a capacitive coupling between the gate and the source contact of the transistor is different from a capacitive coupling between the gate and the drain contact of the transistor.

It is preferred that the cascode transistor M2 has asymmetric resistance and/or asymmetric capacitive coupling. In one aspect, the amplifying transistor M1 can also be asymmetric (in resistance and/or capacitive coupling). Thus, the amplifying transistor M1 may also be the same or similar to transistors 500A, 500B, 500C. In this first configuration where both transistors M1, M2 are asymmetric (in resistance and/or in capacitive coupling), low current performance (e.g., gain, Gm) can be improved over a conventional configuration in which both transistors are symmetric. Also, the first configuration improves current consumption (consumes less current) over the conventional configuration. It should be noted that the amount of asymmetry can be, but need not be, the same between M1 and M2.

In another aspect, the amplifying transistor M1 can be symmetric. In this aspect, the amplifying transistor M1 may not have asymmetric resistance and also may not have asymmetric capacitive coupling. The cascode transistor M2 may remain—i.e., may have asymmetric resistance and/or asymmetric capacity coupling. In this second configuration where only the cascode transistor M2 is asymmetric, low current performance can be improved relative to the conventional configuration but not as much as the first configuration. However, the current consumption of the second configuration can be even better than the first configuration.

Figure 6B:
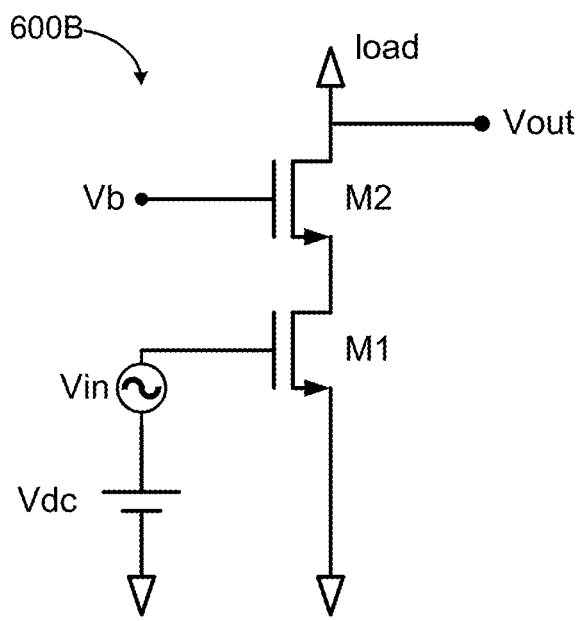

It should be noted that the amplifier 600A is but one of several examples of amplifiers. FIG. 6B illustrates an exemplary circuit of another amplifier 600B that may utilize one or more asymmetric transistors such as transistors 500A, 500B, 500C. Here, the drain of the cascode transistor M2 is illustrated as being connected to a load, which may be other amplifiers. The gate of the cascode transistor M2 is illustrated as being connected to a DC bias voltage Vdc, the source of the amplifying transistor M1 is illustrated as being connect to a low voltage, and the gate of the amplifying transistor M1 is illustrated as being serially connected to the low voltage through a Vin AC signal and a DC voltage Vdc. The drain of the cascode transistor M2 still provides the output voltage, which may be an amplified version of the input voltage Vin.

Figure 6C:
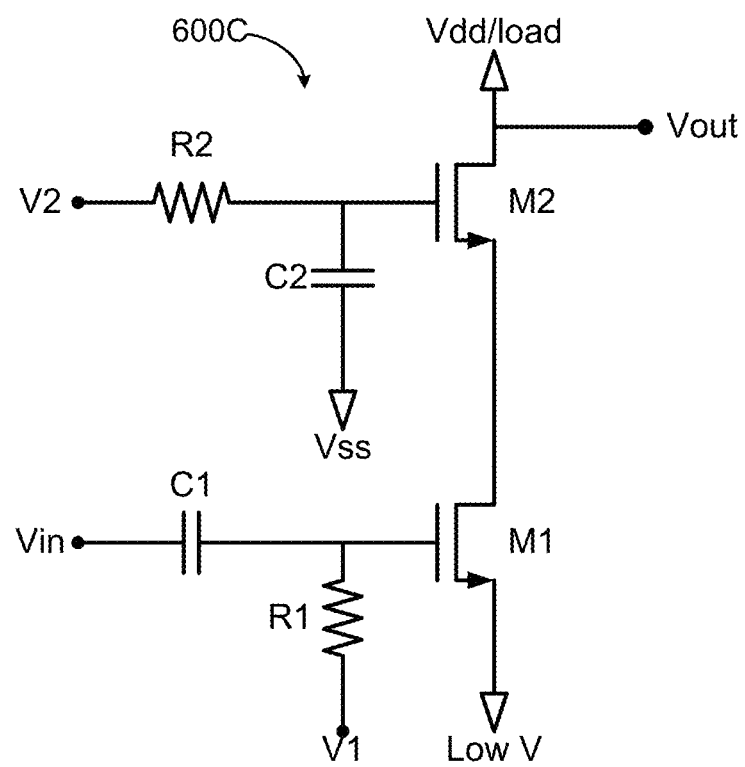

FIG. 6C illustrates yet another exemplary circuit of an amplifier 600C that may utilize one or more asymmetric transistors such as transistors 500A, 500B, 500C. Here, the drain of the cascode transistor M2 is illustrated as being connectable to a load or to Vdd. The gate of the cascode transistor M2 is illustrated as being connected to a voltage V2 through a resistor R2. For example, the voltage V2 may be a bias voltage. The gate of the cascode transistor M2 is also shown as being connected to Vss through a capacitor C2. The gate of the amplifying transistor M1 is illustrated as being connected to an input voltage Vin through a capacitor C1. The voltage Vin may be an input signal. The gate of the amplifying transistor M1 may also be biased by a voltage V1 through a resistor R1. Similar to amplifiers 600A and 600B, the drain of the cascode transistor M2 may provide an amplified version of the input voltage Vin.

The presence/absence of passive components may differ among the amplifiers. However, the following can be common to the amplifiers such as amplifiers 600A, 600B, 600C. Input to the amplifier may be received at the gate of the amplifying transistor M1 and output of the amplifier may be provided from the drain of the cascode transistor M2. That is, the drain of the cascode transistor M2 may be configured to provide an amplified version of the input. Also, the source of the cascode transistor M2 may be connected to the drain of the amplifying transistor M1, and the gate of the cascode transistor M2 may be biased.

Figure 6D:
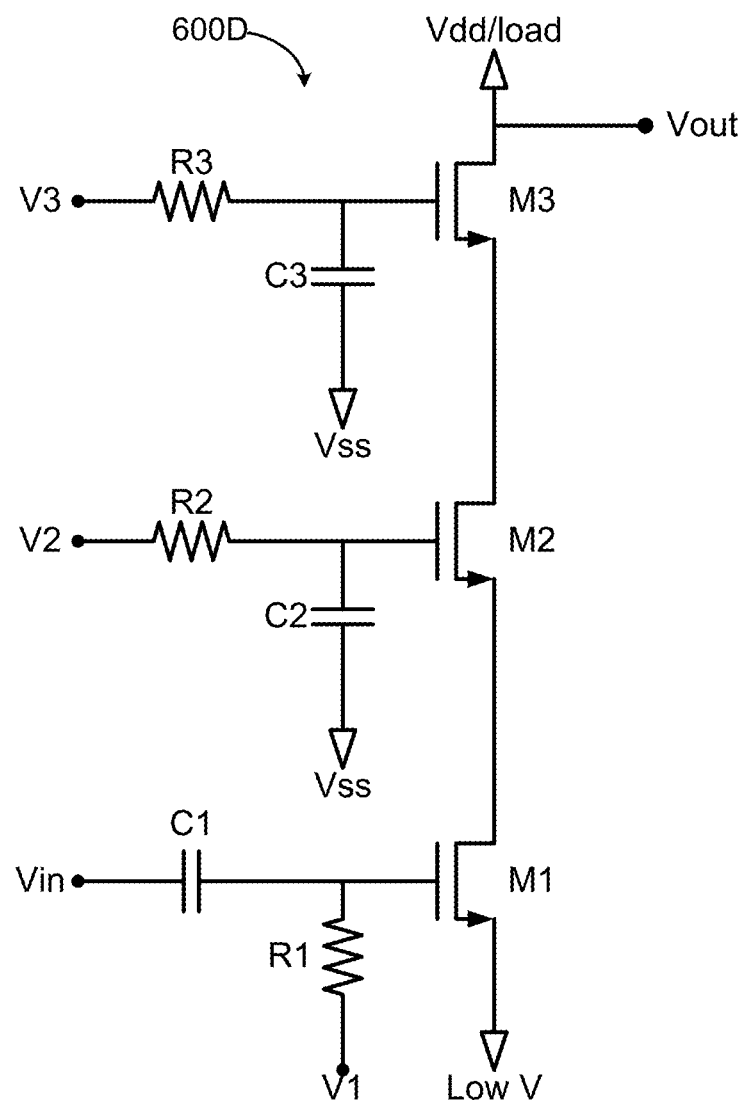

It should be noted that an amplifier is not limited to just two transistors (e.g., M1 and M2) connected in series. FIG. 6D illustrates exemplary circuit of an amplifier 600D that comprises multiple cascode transistors (e.g., two or more). The amplifier 600D is illustrated as comprising an amplifying transistor M1, a first cascode transistor M2, and a second cascode transistor M3 connected in series. Preferably, the first and second cascode transistors M2, M3 are both asymmetric transistors. That is, each of the first and second cascode transistors M2, M3 may have asymmetric resistances and/or asymmetric capacitance couplings. For example, the first and second cascode transistors M2, M3 may respectively have first and second asymmetric resistances. The first and second asymmetric resistances may be the same or different. Alternatively or in addition thereto, the first and second cascode transistors M2, M3 may respectively have first and second asymmetric capacitive couplings, which may be the same or different. Note that the amplifying transistor M1 may be asymmetric or symmetric.

As seen, the source of the first cascode transistor M2 may be configured to connect with the drain of the amplifying transistor M1, and the source of the second cascode transistor M3 may be configured to connect with the drain of the first cascode transistor M2. The drain of the second cascode transistor M3 may be connected to a load or to a voltage (e.g., Vdd).

The gate of the amplifying transistor M1 may receive an input voltage Vin. In an aspect, the input voltage Vin may be received through a capacitor C1 to filter out DC portion of the input voltage Vin. The gate of the amplifying transistor M1 may also be biased by a voltage V1 through a resistor R1.

The gate of the first cascode transistor M2 may be connected to a voltage V2 through a resistor R2. For example, the voltage V2 may be a first bias voltage. The gate of the first cascode transistor M2 may also be connected to Vss through a capacitor C2. The drain of the first cascode transistor M2 may be configured to output a first amplified version of the input voltage Vin (not shown in FIG. 6D).

The gate of the second cascode transistor M3 may be connected to a voltage V3 through a resistor R3. For example, the voltage V3 may be a second bias voltage. The second bias voltage V3 may be same or different from the first bias voltage. The gate of the second cascode transistor M3 may be connected to Vss through a capacitor C3. The drain of the second cascode transistor M3 may be configured to output a second amplified version of the input voltage Vin.

In an aspect, the bodies of any of the amplifiers 600A, 600B, 600C, 600D may be electrically coupled to a body tap region 395 configured to receive a body bias voltage (e.g., see FIG. 3C).

Figure 7A:
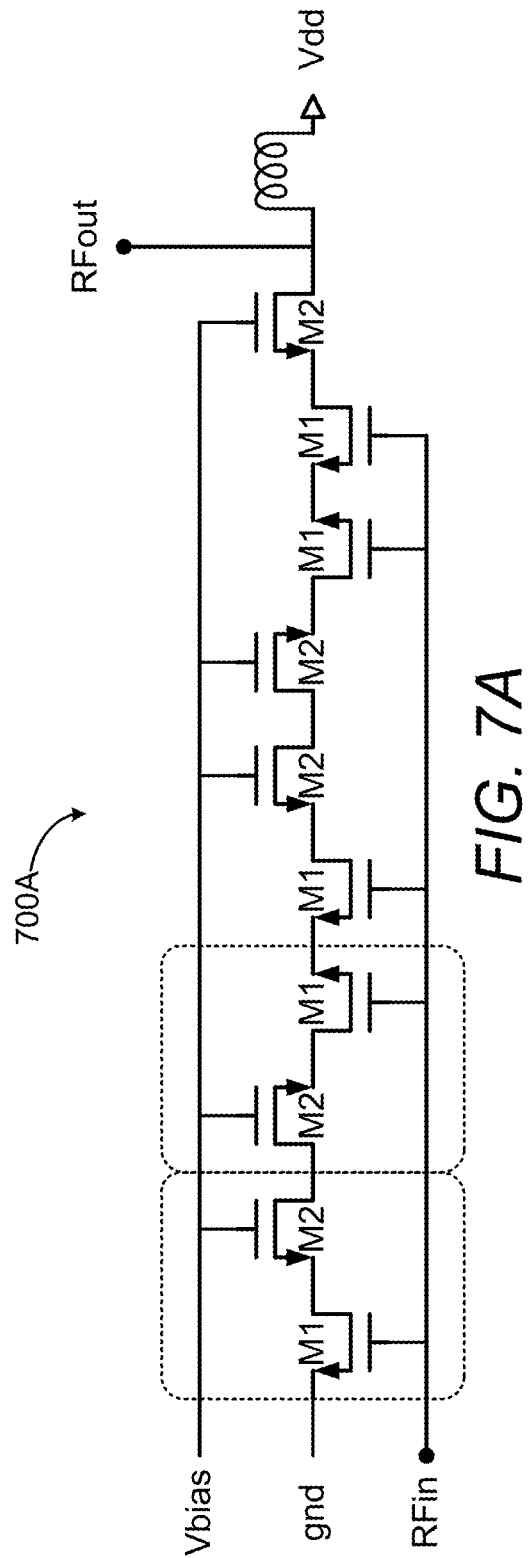
FIGS. 7A and 7B illustrate example stacked amplifiers in accordance with one or more aspects of the disclosure.
Figure 7B:
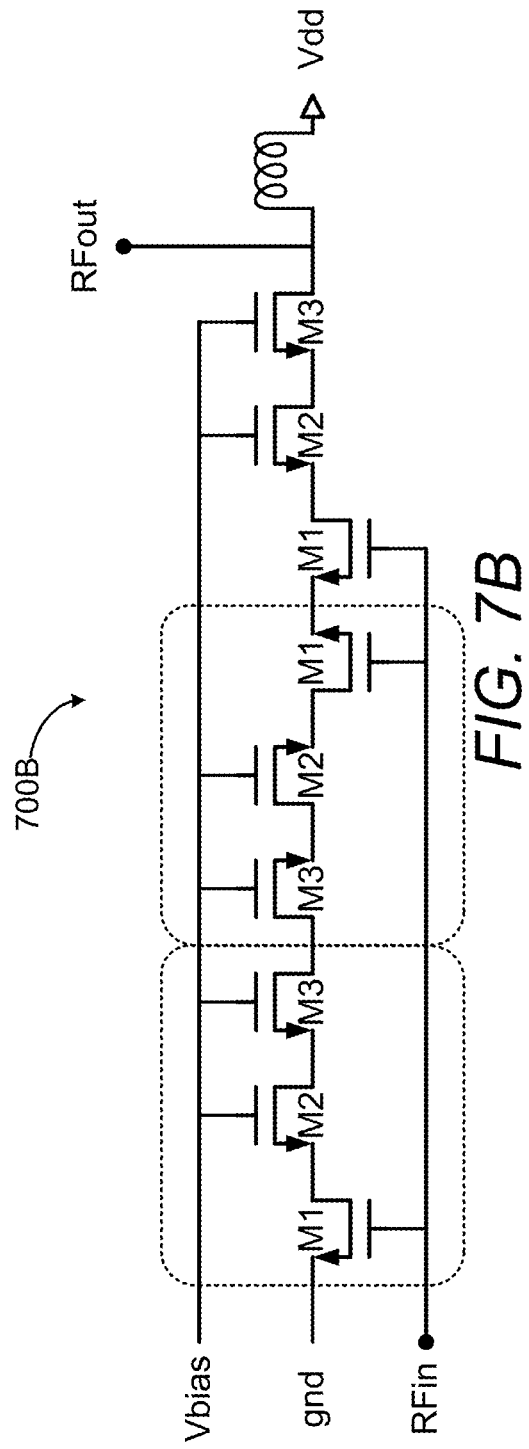

Any of the amplifiers 600A, 600B and/or 600C may be a part of a stacked amplifier illustrated in FIGS. 7A and 7B. The stacked amplifier 700A of FIG. 7A may comprise a plurality of amplifiers such as the amplifiers 600A, 600B, 600C connected in series. In FIG. 7A, five amplifiers are illustrated. However, the actual number of amplifiers can be the same, less, or more. For clarity, first two amplifiers (starting from the left) are each highlighted with dashed rectangles.

In FIG. 7A, connections among the amplifiers may be such that connection between any adjacent pair of amplifiers may alternate. Note that the connections among the plurality of amplifiers may be oriented such that between any two consecutive amplifiers, a source of the amplifying transistor M1 of one of the consecutive amplifiers may be connected to a source of the amplifying transistor M1 of the other of the consecutive amplifiers (e.g., see second and third amplifiers). Alternatively, the connections may alternate such that the drain of the cascode transistor M2 of the one of the consecutive amplifiers is connected to a drain of the cascode transistor M2 of the other of the consecutive amplifiers (e.g., see third and fourth amplifiers).

The gates of the cascode transistors M2 of the plurality of amplifiers may be biased with a bias voltage. For example, the bias voltage may be a DC bias voltage. The gates of the amplifying transistors M1 of the plurality of amplifiers receive the input voltage (e.g., RFin). The source of the amplifying transistor M1 of the first amplifier (e.g., leftmost amplifier may) be connected to Vss voltage (e.g., ground), and the drain of the cascode transistor M2 of the last amplifier (e.g., rightmost amplifier) may provide the final output voltage (e.g., RFout).

The stacked amplifier 700B of FIG. 7B also may comprise a plurality of amplifiers. In this instance, one or more amplifiers of the stacked amplifier 700B may comprise multiple cascode transistors such as the amplifier 600D connected in series. In FIG. 7B, three amplifiers are illustrated. However, the actual number of amplifiers can be the same, less, or more. For clarity, first two amplifiers (starting from the left) are each highlighted with dashed rectangles.

In FIG. 7B, connections among the amplifiers may be such that connection between any adjacent pair of amplifiers may alternate. The connections among the plurality of amplifiers may be oriented such that between any two consecutive amplifiers, a source of the amplifying transistor M1 of one of the consecutive amplifiers may be connected to a source of the amplifying transistor M1 of the other of the consecutive amplifiers. Alternatively, the connections may alternate such that the drain of the second cascode transistor M3 of the one of the consecutive amplifiers is connected to a drain of the second cascode transistor M3 of the other of the consecutive amplifiers.

The gates of the first and second cascode transistors M2, M3 of the plurality of amplifiers may be biased with a bias voltage. While not shown, the gates of the first and second cascode transistors M2, M3 may be biased with different bias voltages such as first and second bias voltages. The gates of the amplifying transistors M1 of the plurality of amplifiers receive the input voltage (e.g., RFin). The source of the amplifying transistor M1 of the first amplifier (e.g., leftmost amplifier may) be connected to Vss voltage (e.g., ground), and the drain of the cascode transistor M2 of the last amplifier (e.g., rightmost amplifier) may provide the final output voltage (e.g., RFout).

While not specifically shown, it should be noted that the stacked amplifier may comprise amplifiers with differing number of cascode transistors. For example, a stacked amplifier may comprise a mixture of single cascode transistor amplifiers (such as amplifiers 600A, 600B, 600C) and multiple cascode transistor amplifiers (such as amplifier 600D).

Figure 8A:
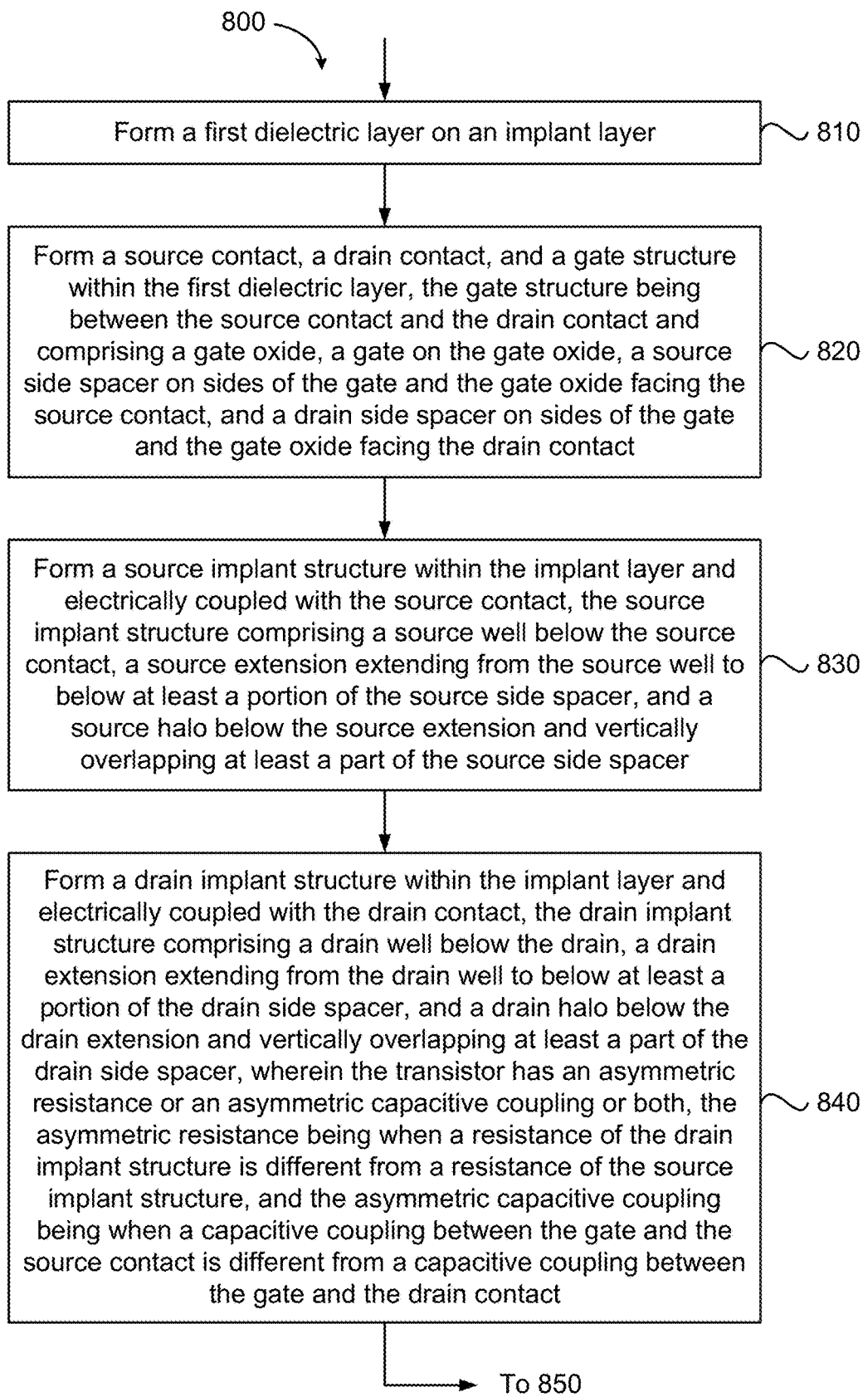
FIGS. 8A and 8B illustrate a flow chart of an example method of manufacturing a transistor in accordance with at one or more aspects of the disclosure.
Figure 8B:
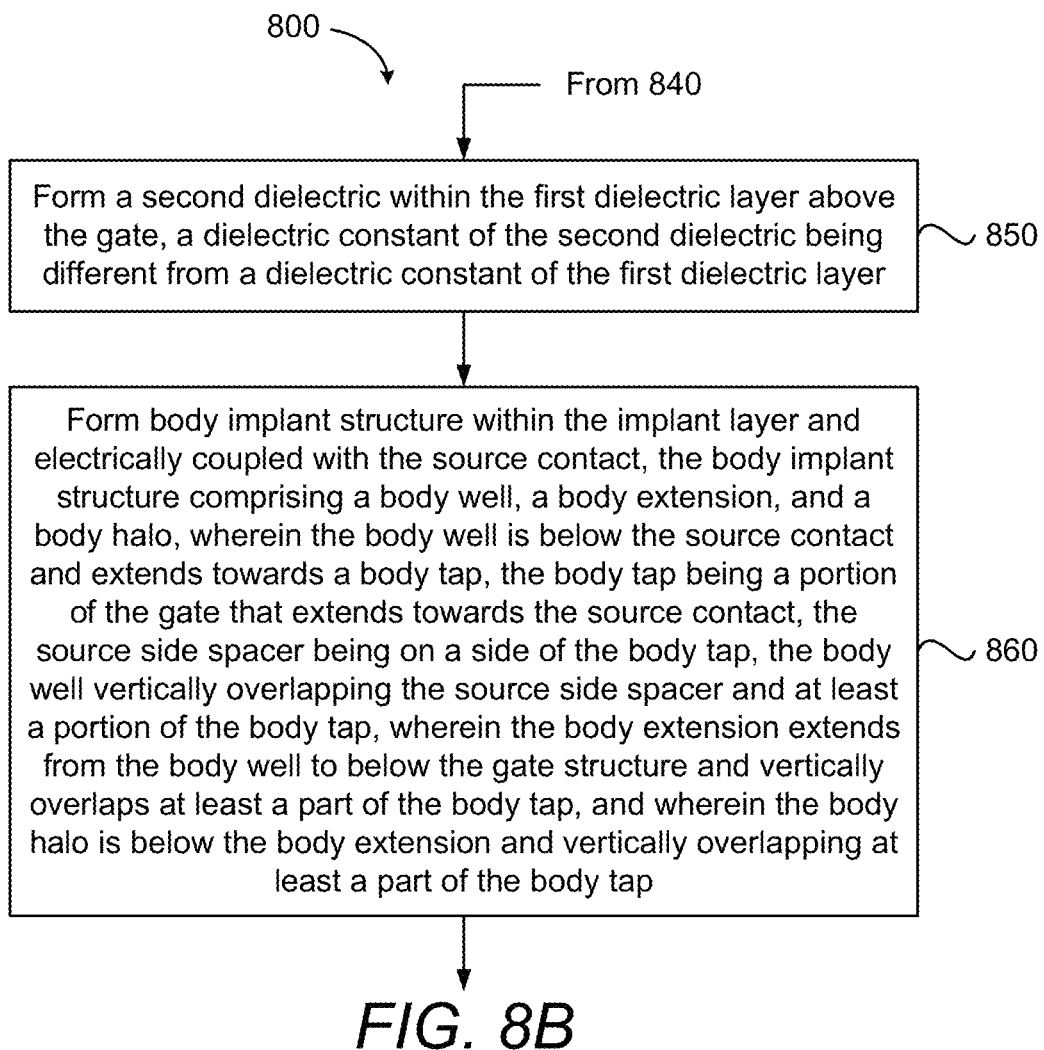

FIGS. 8A and 8B illustrate a flow chart of an example method 800 of manufacturing a transistor (e.g., transistor 500A, 500B, 500C) in accordance with at one or more aspects of the disclosure. In block 810, the first dielectric layer 540 may be formed on an implant layer 530.

In block 820, the source contact 550, the drain contact 560, and the gate structure (comprising the gate 570, the gate oxide 575, the source side spacer 581, and the drain side spacer 582) may be formed within the first dielectric layer 540. The gate structure may be between the source contact 550 and the drain contact 560. The gate oxide 575 may be formed on the implant layer 530, the gate 570 may be formed on the gate oxide 575, the source side spacer 581 may be formed on sides of the gate 570 and the gate oxide 575 facing the source contact 550, and the drain side spacer 582 may be formed on sides of the gate 570 and the gate oxide 575 facing the drain contact 560.

In block 830, the source implant structure (comprising the source well 552, the source extension 554, and the source halo 556) may be formed within the implant layer 530. The source implant structure may be electrically coupled with the source contact 550. The source well 552 may be formed below the source contact 550, the source extension 554 may extend from the source well 552 to below at least a portion of the source side spacer 581, and the source halo 556 may be formed below the source extension 554 and may vertically overlap at least a part of the source side spacer 581.

In block 840, the drain implant structure (comprising the drain well 562, the drain extension 564, and the drain halo 566) may be formed within the implant layer 530. The drain implant structure may be electrically coupled with the drain contact 560. The drain well 562 may be formed below the drain contact 560, the drain extension 564 may extend from the drain well 562 to below at least a portion of the drain side spacer 582, and the drain halo 566 may be formed below the drain extension 564 and may vertically overlap at least a part of the drain side spacer 582.

In an aspect, a distance between the drain side spacer 582 and the drain contact 560 may be less than a distance between the source side spacer 581 and the source contact 550. In this instance, performing blocks 830 and 840 may comprise implanting the implant layer 530 with a dopant at a tilt angle that is not normal to an upper surface of the implant layer 530.

In block 850, a second dielectric 545 may be formed within the first dielectric layer 540 above the gate 570. A dielectric constant of the second dielectric 545 may be different from a dielectric constant of the first dielectric layer 540.

In block 860, the body implant structure (comprising the body well 592, the body extension 594, and the body halo 596) may be formed within the implant layer 530. The body implant structure may be electrically coupled with the source contact 550. The body well 592 may be formed below the source contact 550 and extend toward the body tap 390. The body well 592 may vertically overlap the source side spacer 581 (which may be on the side of the body tap 390) and overlap at least a portion of the body tap 390. The body extension 594 may extend from the body well 592 to below the gate structure and may vertically overlap at least a part of the body tap 390. The body halo 596 may be formed below the body extension 594 and may vertically overlap at least a part of the body tap 390.

Figure 9:
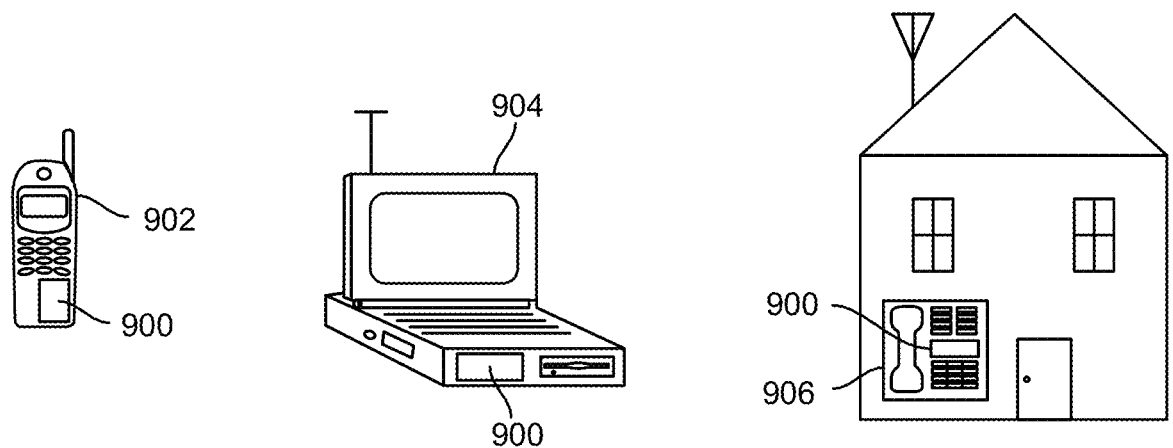
FIG. 9 illustrates various electronic devices which may utilize one or more aspects of the disclosure.

FIG. 9 illustrates various electronic devices 900 that may be integrated with any of the aforementioned devices in accordance with various aspects of the disclosure. For example, a mobile phone device 902, a laptop computer device 904, and a fixed location terminal device 906 may each be considered generally user equipment (UE) and may include one or more transistors (e.g., transistors 500A, 500B) and/or amplifiers (e.g., amplifiers 600A, 600B, 700A, 700B) as described herein. The devices 902, 904, 906 illustrated in FIG. 14 are merely exemplary. Other electronic devices may also include the transistors and/or amplifiers including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

Implementation examples are described in the following numbered clauses:

Clause 1: A transistor, comprising: a first dielectric layer on an implant layer; a source contact, a drain contact, and a gate structure within the first dielectric layer, the gate structure being between the source contact and the drain contact and comprising a gate oxide, a gate on the gate oxide, a source side spacer on sides of the gate and the gate oxide facing the source contact, and a drain side spacer on sides of the gate and the gate oxide facing the drain contact; a source implant structure within the implant layer and electrically coupled with the source contact, the source implant structure comprising a source well below the source contact, a source extension extending from the source well to below at least a portion of the source side spacer, and a source halo below the source extension and vertically overlapping at least a part of the source side spacer; and a drain implant structure within the implant layer and electrically coupled with the drain contact, the drain implant structure comprising a drain well below the drain contact, a drain extension extending from the drain well to below at least a portion of the drain side spacer, and a drain halo below the drain extension and vertically overlapping at least a part of the drain side spacer, wherein the transistor has an asymmetric resistance or an asymmetric capacitive coupling or both, the asymmetric resistance being when a resistance of the drain implant structure is different from a resistance of the source implant structure, and the asymmetric capacitive coupling being when a capacitive coupling between the gate and the source contact is different from a capacitive coupling between the gate and the drain contact.

Clause 2: The transistor of clause 1, wherein the resistance of the drain implant structure is greater than the resistance of the source implant structure.

Clause 3: The transistor of clause 2, wherein the drain well is less doped than the source well, or wherein the drain extension is less doped than the source extension, or wherein the drain halo is less doped than the source halo, or any combination thereof.

Clause 4: The transistor of any of clauses 2-3, wherein the drain extension has a smaller cross section than the source extension, or wherein the drain halo is smaller than the source halo, or both.

Clause 5: The transistor of any of clauses 1-4, wherein a distance between the drain side spacer and the drain contact is less than a distance between the source side spacer and the source contact.

Clause 6: The transistor of clause 5, wherein the drain side spacer is thicker than the source side spacer, or wherein a center of the gate is closer to the drain contact than to the source contact, or both.

Clause 7: The transistor of any of clauses 1-6, further comprising: a second dielectric within the first dielectric layer above the gate, a dielectric constant of the second dielectric being different from a dielectric constant of the first dielectric layer.

Clause 8: The transistor of clause 7, wherein the second dielectric is a low-k dielectric or an air gap, or wherein a center of the second dielectric is not vertically aligned with a center of the gate, or both.

Clause 9: The transistor of any of clauses 7-8, further comprising a body implant structure within the implant layer and electrically coupled with the source contact, the body implant structure comprising a body well, a body extension, and a body halo, wherein the body well is below the source contact and extends towards a body tap, the body tap being a portion of the gate that extends towards the source contact, the source side spacer being on a side of the body tap, the body well vertically overlapping the source side spacer and at least a first part of the body tap, wherein the body extension extends from the body well to below the gate structure and vertically overlaps at least a second part of the body tap, and wherein the body halo is below the body extension and vertically overlapping at least a third part of the body tap.

Clause 10: The transistor of clause 9, wherein the body well is doped opposite to a doping of the drain well.

Clause 11: The transistor of any of clauses 1-10, wherein the transistor is a part of a low noise amplifier (LNA).

Clause 12: The transistor of any of clauses 1-11, wherein the transistor is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 13: A method of fabricating a transistor, the method comprising: forming a first dielectric layer on an implant layer, forming a source contact, a drain contact, and a gate structure within the first dielectric layer, the gate structure being between the source contact and the drain contact and comprising a gate oxide, a gate on the gate oxide, a source side spacer on sides of the gate and the gate oxide facing the source contact, and a drain side spacer on sides of the gate and the gate oxide facing the drain contact; forming a source implant structure within the implant layer and electrically coupled with the source contact, the source implant structure comprising a source well below the source contact, a source extension extending from the source well to below at least a portion of the source side spacer, and a source halo below the source extension and vertically overlapping at least a part of the source side spacer; and forming a drain implant structure within the implant layer and electrically coupled with the drain contact, the drain implant structure comprising a drain well below the drain contact, a drain extension extending from the drain well to below at least a portion of the drain side spacer, and a drain halo below the drain extension and vertically overlapping at least a part of the drain side spacer, wherein the transistor has an asymmetric resistance or an asymmetric capacitive coupling or both, the asymmetric resistance being when a resistance of the drain implant structure is different from a resistance of the source implant structure, and the asymmetric capacitive coupling being when a capacitive coupling between the gate and the source contact is different from a capacitive coupling between the gate and the drain contact.

Clause 14: The method of clause 13, wherein the resistance of the drain implant structure is greater than the resistance of the source implant structure.

Clause 15: The method of clause 14, wherein the drain well is less doped than the source well, or wherein the drain extension is less doped than the source extension, or wherein the drain halo is less doped than the source halo, or any combination thereof.

Clause 16: The method of any of clauses 14-15, wherein the drain extension has a smaller cross section than the source extension, or wherein the drain halo is smaller than the source halo, or both.

Clause 17: The method of any of clauses 13-16, wherein a distance between the drain side spacer and the drain contact is less than a distance between the source side spacer and the source contact.

Clause 18: The method of clause 17, wherein the drain side spacer is thicker than the source side spacer, or wherein a center of the gate is closer to the drain contact than to the source contact, or both.

Clause 19: The method of any of clauses 13-18, further comprising: forming a second dielectric within the first dielectric layer above the gate, a dielectric constant of the second dielectric being different from a dielectric constant of the first dielectric layer.

Clause 20: The method of clause 19, wherein the second dielectric is a low-k dielectric or an air gap, or wherein a center of the second dielectric is not vertically aligned with a center of the gate, or both.

Clause 21: The method of any of clauses 19-20, further comprising: forming a body implant structure within the implant layer and electrically coupled with the source contact, the body implant structure comprising a body well, a body extension, and a body halo, wherein the body well is below the source contact and extends towards a body tap, the body tap being a portion of the gate that extends towards the source contact, the source side spacer being on a side of the body tap, the body well vertically overlapping the source side spacer and at least a first part of the body tap, wherein the body extension extends from the body well to below the gate structure and vertically overlaps at least a second part of the body tap, and wherein the body halo is below the body extension and vertically overlapping at least a third part of the body tap.

Clause 22: The method of clause 21, wherein the body well is doped opposite to a doping of the drain well.

Clause 23: An amplifier, comprising: an amplifying transistor, a source of the amplifying transistor being configured to receive a low voltage, and a gate of the amplifying transistor being configured to receive an input voltage; and a cascode transistor, a source of the cascode transistor being configured to connect with a drain of the amplifying transistor, a gate of the cascode transistor being configured to receive a bias voltage, and a drain of the cascode transistor being configured to output an amplified version of the input voltage, wherein the cascode transistor has an asymmetric resistance or an asymmetric capacitive coupling or both, the asymmetric resistance of a transistor being when a resistance of a drain of the transistor is different from a resistance of a source of the transistor, and the asymmetric capacitive coupling of a transistor being when a capacitive coupling between a gate and a source of the transistor is different from a capacitive coupling between the gate and a drain of the transistor.

Clause 24: The amplifier of clause 23, wherein the cascode transistor comprises: a first dielectric layer on an implant layer; a source contact, a drain contact, and a gate structure within the first dielectric layer, the gate structure being between the source contact and the drain contact and comprising a gate oxide, the gate on the gate oxide, a source side spacer on sides of the gate and the gate oxide facing the source contact, and a drain side spacer on sides of the gate and the gate oxide facing the drain contact; a source implant structure within the implant layer and electrically coupled with the source contact, the source implant structure comprising a source well below the source contact, a source extension extending from the source well to below at least a portion of the source side spacer, and a source halo below the source extension and vertically overlapping at least a part of the source side spacer; and a drain implant structure within the implant layer and electrically coupled with the drain contact, the drain implant structure comprising a drain well below the drain contact, a drain extension extending from the drain well to below at least a portion of the drain side spacer, and a drain halo below the drain extension and vertically overlapping at least a part of the drain side spacer.

Clause 25: The amplifier of clause 24, wherein the cascode transistor further comprises a body implant structure within the implant layer and electrically coupled with the source contact, the body implant structure comprising a body well, a body extension, and a body halo, wherein the body well is below the source contact and extends towards a body tap, the body tap being a portion of the gate that extends towards the source contact, the source side spacer being on a side of the body tap, the body well vertically overlapping the source side spacer and at least a first part of the body tap, wherein the body extension extends from the body well to below the gate structure and vertically overlaps at least a second part of the body tap, and wherein the body halo is below the body extension and vertically overlapping at least a third part of the body tap.

Clause 26: The amplifier of any of clauses 23-25, wherein the amplifying transistor has an asymmetric resistance or an asymmetric capacitive coupling or both.

Clause 27: The amplifier of any of clauses 23-26, wherein the amplifier is one amplifier of a stacked amplifier comprising a plurality of amplifiers connected in series, wherein connections among the plurality of amplifiers are oriented such that between any two consecutive amplifiers, a source of an amplifying transistor of one of the consecutive amplifiers is connected to a source of an amplifying transistor of other of the consecutive amplifiers, or a drain of a cascode transistor of the one of the consecutive amplifiers is connected to a drain of a cascode transistor of the other of the consecutive amplifiers, wherein gates of cascode transistors of the plurality of amplifiers are biased with a bias voltage, wherein gates of amplifying transistors of the plurality of amplifiers receive the input voltage, wherein a source of an amplifying transistor of a first amplifier is connected to the low voltage, and wherein a drain of a cascode transistor of a last amplifier provides a final output voltage.

Clause 28: The amplifier of any of clauses 23-27, wherein the cascode transistor is a first cascode transistor, the bias voltage received by the gate of the first cascode transistor is a first bias voltage, the amplified version of the input voltage at the drain of the first cascode transistor is a first amplified version, the asymmetric resistance of the first cascode transistor is a first asymmetric resistance, and the asymmetric capacitive coupling of the first cascode transistor is a first asymmetric capacitive coupling, wherein the amplifier further comprises a second cascode transistor, a source of the second cascode transistor being configured to connect with the drain of the first cascode transistor, a gate of the second cascode transistor being configured to receive a second bias voltage, and a drain of the second cascode transistor being configured to output a second amplified version of the input voltage, and wherein the second cascode transistor has a second asymmetric resistance or a second asymmetric capacitive coupling or both.

Clause 29: The amplifier of clause 28, wherein the amplifier is one amplifier of a stacked amplifier comprising a plurality of amplifiers connected in series, wherein connections among the plurality of amplifiers are oriented such that between any two consecutive amplifiers, a source of an amplifying transistor of one of the consecutive amplifiers is connected to a source of an amplifying transistor of other of the consecutive amplifiers, or a drain of a second cascode transistor of the one of the consecutive amplifiers is connected to a drain of a second cascode transistor of the other of the consecutive amplifiers, wherein gates of first cascode transistors of the plurality of amplifiers are biased with the first bias voltage, wherein gates of second cascode transistors of the plurality of amplifiers are biased with the second bias voltage, wherein gates of amplifying transistors of the plurality of amplifiers receive the input voltage, wherein a source of an amplifying transistor of a first amplifier is connected to the low voltage, and wherein a drain of a second cascode transistor of a last amplifier provides a final output voltage.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A transistor, comprising:
   a first dielectric layer on an implant layer;
   a source contact, a drain contact, and a gate structure within the first dielectric layer, the gate structure being between the source contact and the drain contact and comprising a gate oxide, a gate on the gate oxide, a source side spacer on sides of the gate and the gate oxide facing the source contact, and a drain side spacer on sides of the gate and the gate oxide facing the drain contact;
   a source implant structure within the implant layer and electrically coupled with the source contact, the source implant structure comprising a source well below the source contact, a source extension extending from the source well to below at least a portion of the source side spacer, and a source halo below the source extension and vertically overlapping at least a part of the source side spacer;
   a drain implant structure within the implant layer and electrically coupled with the drain contact, the drain implant structure comprising a drain well below the drain contact, a drain extension extending from the drain well to below at least a portion of the drain side spacer, and a drain halo below the drain extension and vertically overlapping at least a part of the drain side spacer,
   wherein the transistor has an asymmetric resistance or an asymmetric capacitive coupling or both, the asymmetric resistance being when a resistance of the drain implant structure is different from a resistance of the source implant structure, and the asymmetric capacitive coupling being when a capacitive coupling between the gate and the source contact is different from a capacitive coupling between the gate and the drain contact; and
   a second dielectric within the first dielectric layer above the gate, a dielectric constant of the second dielectric being different from a dielectric constant of the first dielectric layer.

2. The transistor of claim 1, wherein the resistance of the drain implant structure is greater than the resistance of the source implant structure.

3. The transistor of claim 2,
   wherein the drain well is less doped than the source well, or
   wherein the drain extension is less doped than the source extension, or
   wherein the drain halo is less doped than the source halo, or
   any combination thereof.

4. The transistor of claim 2,
   wherein the drain extension has a smaller cross section than the source extension, or
   wherein the drain halo is smaller than the source halo, or both.

5. The transistor of claim 1, wherein a distance between the drain side spacer and the drain contact is less than a distance between the source side spacer and the source contact.

6. The transistor of claim 5,
wherein the drain side spacer is thicker than the source side spacer, or
wherein a center of the gate is closer to the drain contact than to the source contact, or
both.

7. The transistor of claim 1, wherein the transistor is a part of a low noise amplifier (LNA).

8. The transistor of claim 1,
wherein the second dielectric is a low-k dielectric or an air gap, or
wherein a center of the second dielectric is not vertically aligned with a center of the gate, or
both.

9. The transistor of claim 1, further comprising a body implant structure within the implant layer and electrically coupled with the source contact, the body implant structure comprising a body well, a body extension, and a body halo,
wherein the body well is below the source contact and extends towards a body tap, the body tap being a portion of the gate that extends towards the source contact, the source side spacer being on a side of the body tap, the body well vertically overlapping the source side spacer and at least a first part of the body tap,
wherein the body extension extends from the body well to below the gate structure and vertically overlaps at least a second part of the body tap, and
wherein the body halo is below the body extension and vertically overlapping at least a third part of the body tap.

10. The transistor of claim 9, wherein the body well is doped opposite to a doping of the drain well.

11. The transistor of claim 1, wherein the transistor is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

12. A method of fabricating a transistor, the method comprising:
forming a first dielectric layer on an implant layer,
forming a source contact, a drain contact, and a gate structure within the first dielectric layer, the gate structure being between the source contact and the drain contact and comprising a gate oxide, a gate on the gate oxide, a source side spacer on sides of the gate and the gate oxide facing the source contact, and a drain side spacer on sides of the gate and the gate oxide facing the drain contact;
forming a source implant structure within the implant layer and electrically coupled with the source contact, the source implant structure comprising a source well below the source contact, a source extension extending from the source well to below at least a portion of the source side spacer, and a source halo below the source extension and vertically overlapping at least a part of the source side spacer;
forming a drain implant structure within the implant layer and electrically coupled with the drain contact, the drain implant structure comprising a drain well below the drain contact, a drain extension extending from the drain well to below at least a portion of the drain side spacer, and a drain halo below the drain extension and vertically overlapping at least a part of the drain side spacer,
wherein the transistor has an asymmetric resistance or an asymmetric capacitive coupling or both, the asymmetric resistance being when a resistance of the drain implant structure is different from a resistance of the source implant structure, and the asymmetric capacitive coupling being when a capacitive coupling between the gate and the source contact is different from a capacitive coupling between the gate and the drain contact; and
forming a second dielectric within the first dielectric layer above the gate, a dielectric constant of the second dielectric being different from a dielectric constant of the first dielectric layer.

13. The method of claim 12, further comprising:
forming a body implant structure within the implant layer and electrically coupled with the source contact, the body implant structure comprising a body well, a body extension, and a body halo,
wherein the body well is below the source contact and extends towards a body tap, the body tap being a portion of the gate that extends towards the source contact, the source side spacer being on a side of the body tap, the body well vertically overlapping the source side spacer and at least a first part of the body tap,
wherein the body extension extends from the body well to below the gate structure and vertically overlaps at least a second part of the body tap, and
wherein the body halo is below the body extension and vertically overlapping at least a third part of the body tap.

14. The method of claim 12, wherein the resistance of the drain implant structure is greater than the resistance of the source implant structure.

15. The method of claim 14,
wherein the drain well is less doped than the source well, or
wherein the drain extension is less doped than the source extension, or
wherein the drain halo is less doped than the source halo, or
any combination thereof.

16. The method of claim 14,
wherein the drain extension has a smaller cross section than the source extension, or
wherein the drain halo is smaller than the source halo, or
both.

17. The method of claim 12, wherein a distance between the drain side spacer and the drain contact is less than a distance between the source side spacer and the source contact.

18. The method of claim 17,
wherein the drain side spacer is thicker than the source side spacer, or
wherein a center of the gate is closer to the drain contact than to the source contact, or
both.

19. The method of claim 13, wherein the body well is doped opposite to a doping of the drain well.

20. The method of claim 12,
wherein the second dielectric is a low-k dielectric or an air gap, or
wherein a center of the second dielectric is not vertically aligned with a center of the gate, or
both.

21. An amplifier comprising:
an amplifying transistor, a source of the amplifying transistor being configured to receive a low voltage, and a gate of the amplifying transistor being configured to receive an input voltage; and
a cascode transistor, a source of the cascode transistor being configured to connect with a drain of the amplifying transistor, a gate of the cascode transistor being configured to receive a bias voltage, and a drain of the cascode transistor being configured to output an amplified version of the input voltage,
wherein the cascode transistor has an asymmetric resistance or an asymmetric capacitive coupling or both, the asymmetric resistance of a transistor being when a resistance of a drain of the transistor is different from a resistance of a source of the transistor, and the asymmetric capacitive coupling of a transistor being when a capacitive coupling between a gate and a source of the transistor is different from a capacitive coupling between the gate and a drain of the transistor;
wherein the cascode transistor comprises:
a first dielectric layer on an implant layer;
a source contact, a drain contact, and a gate structure within the first dielectric layer, the gate structure being between the source contact and the drain contact and comprising a gate oxide, the gate on the gate oxide, a source side spacer on sides of the gate and the gate oxide facing the source contact, and a drain side spacer on sides of the gate and the gate oxide facing the drain contact;
a source implant structure within the implant layer and electrically coupled with the source contact, the source implant structure comprising a source well below the source contact, a source extension extending from the source well to below at least a portion of the source side spacer, and a source halo below the source extension and vertically overlapping at least a part of the source side spacer; and
a drain implant structure within the implant layer and electrically coupled with the drain contact, the drain implant structure comprising a drain well below the drain contact, a drain extension extending from the drain well to below at least a portion of the drain side spacer, and a drain halo below the drain extension and vertically overlapping at least a part of the drain side spacer;
wherein the cascode transistor further comprises a body implant structure within the implant layer and electrically coupled with the source contact, the body implant structure comprising a body well, a body extension, and a body halo,
wherein the body well is below the source contact and extends towards a body tap, the body tap being a portion of the gate that extends towards the source contact, the source side spacer being on a side of the body tap, the body well vertically overlapping the source side spacer and at least a first part of the body tap,
wherein the body extension extends from the body well to below the gate structure and vertically overlaps at least a second part of the body tap, and wherein the body halo is below the body extension and vertically overlapping at least a third part of the body tap.

22. The amplifier of claim 21,
wherein the cascode transistor is a first cascode transistor, the bias voltage received by the gate of the first cascode transistor is a first bias voltage, the amplified version of the input voltage at the drain of the first cascode transistor is a first amplified version, the asymmetric resistance of the first cascode transistor is a first asymmetric resistance, and the asymmetric capacitive coupling of the first cascode transistor is a first asymmetric capacitive coupling,
wherein the amplifier further comprises a second cascode transistor, a source of the second cascode transistor being configured to connect with the drain of the first cascode transistor, a gate of the second cascode transistor being configured to receive a second bias voltage, and a drain of the second cascode transistor being configured to output a second amplified version of the input voltage, and
wherein the second cascode transistor has a second asymmetric resistance or a second asymmetric capacitive coupling or both.

23. The amplifier of claim 22,
wherein the amplifier is one amplifier of a stacked amplifier comprising a plurality of amplifiers connected in series,
wherein connections among the plurality of amplifiers are oriented such that between any two consecutive amplifiers,
a source of an amplifying transistor of one of the consecutive amplifiers is connected to a source of an amplifying transistor of other of the consecutive amplifiers, or
a drain of a second cascode transistor of the one of the consecutive amplifiers is connected to a drain of a second cascode transistor of the other of the consecutive amplifiers,
wherein gates of first cascode transistors of the plurality of amplifiers are biased with the first bias voltage,
wherein gates of second cascode transistors of the plurality of amplifiers are biased with the second bias voltage,
wherein gates of amplifying transistors of the plurality of amplifiers receive the input voltage,
wherein a source of an amplifying transistor of a first amplifier is connected to the low voltage, and
wherein a drain of a second cascode transistor of a last amplifier provides a final output voltage.

24. The amplifier of claim 21, wherein the amplifying transistor has an asymmetric resistance or an asymmetric capacitive coupling or both.

25. The amplifier of claim 21,
wherein the amplifier is one amplifier of a stacked amplifier comprising a plurality of amplifiers connected in series,
wherein connections among the plurality of amplifiers are oriented such that between any two consecutive amplifiers,
a source of an amplifying transistor of one of the consecutive amplifiers is connected to a source of an amplifying transistor of other of the consecutive amplifiers, or a drain of a cascode transistor of the one of the consecutive amplifiers is connected to a drain of a cascode transistor of the other of the consecutive amplifiers, wherein gates of cascode transistors of the plurality of amplifiers are biased with the bias voltage, wherein gates of amplifying transistors of the plurality of amplifiers receive the input voltage, wherein a source of an amplifying transistor of a first amplifier is connected to the low voltage, and wherein a drain of a cascode transistor of a last amplifier provides a final output voltage.

\* \* \* \* \*